US009031801B2

(12) United States Patent
Sugaya et al.

(10) Patent No.: US 9,031,801 B2
(45) Date of Patent: May 12, 2015

(54) PORTABLE DEVICE, BATTERY PACK, DISPLAY CONTROLLING METHOD, AND DISPLAY CONTROLLING PROGRAM

(75) Inventors: Takayuki Sugaya, Tokyo (JP); Takanori Asai, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 1083 days.

(21) Appl. No.: 13/120,980

(22) PCT Filed: Jul. 9, 2009

(86) PCT No.: PCT/JP2009/062525
§ 371 (c)(1),
(2), (4) Date: Mar. 25, 2011

(87) PCT Pub. No.: WO2010/035567
PCT Pub. Date: Apr. 1, 2010

(65) Prior Publication Data
US 2011/0178746 A1 Jul. 21, 2011

(30) Foreign Application Priority Data

Sep. 29, 2008 (JP) ................... 2008-249600

(51) Int. Cl.
*G01R 31/36* (2006.01)
*H01M 10/48* (2006.01)
*H01M 10/44* (2006.01)
(Continued)

(52) U.S. Cl.
CPC .............. *H01M 10/48* (2013.01); *H02J 7/0021* (2013.01); *G01R 31/3679* (2013.01); *G01R 31/3682* (2013.01); *H01M 10/44* (2013.01); *H02J 7/0047* (2013.01); *H02J 2007/0049* (2013.01); *H02J 2007/005* (2013.01); *H04M 1/72519* (2013.01); *H04M 1/72544* (2013.01)

(58) Field of Classification Search
USPC ............................................ 702/63
See application file for complete search history.

(56) References Cited

U.S. PATENT DOCUMENTS

| | | | | | |
|---|---|---|---|---|---|
| 5,325,041 | A | * | 6/1994 | Briggs | 320/149 |
| 5,680,027 | A | * | 10/1997 | Hiratsuka et al. | 320/106 |
| 6,174,617 | B1 | * | 1/2001 | Hiratsuka et al. | 429/90 |

(Continued)

FOREIGN PATENT DOCUMENTS

| | | |
|---|---|---|
| JP | 11-285155 | 10/1999 |
| JP | 2001-051029 | 2/2001 |

(Continued)

OTHER PUBLICATIONS

International Search Report mailed on Oct. 13, 2009.
(Continued)

*Primary Examiner* — Sujoy Kundu
*Assistant Examiner* — Paul D Lee
(74) *Attorney, Agent, or Firm* — IPUSA, PLLC

(57) ABSTRACT

A portable device driven by a secondary battery which is chargeable and dischargeable, the portable device including a full charge detecting unit configured to detect full charge of the secondary battery in receipt of a report of the full charge and acquires capacity data indicative of a capacity of the secondary battery, a memory controlling unit configured to store the capacity data acquired by the full charge detecting unit in a memory unit, and a display control unit configured to cause a display unit of the portable device to display the capacity data stored by the memory controlling unit in chronological order.

20 Claims, 16 Drawing Sheets

(51) Int. Cl.
*H04M 1/725* (2006.01)
*H02J 7/00* (2006.01)

(56) References Cited

U.S. PATENT DOCUMENTS

| | | | |
|---|---|---|---|
| 6,396,407 B1 * | 5/2002 | Kobayashi | 340/636.12 |
| 8,234,087 B2 * | 7/2012 | Majima | 702/63 |
| 2002/0113575 A1 * | 8/2002 | Lee | 320/132 |
| 2002/0195996 A1 | 12/2002 | Nakatsuji | |
| 2004/0164715 A1 * | 8/2004 | Nawa et al. | 320/149 |
| 2006/0158151 A1 * | 7/2006 | Kimura | 320/106 |
| 2008/0290839 A1 * | 11/2008 | Hayashi | 320/137 |
| 2009/0037124 A1 * | 2/2009 | Majima | 702/63 |

FOREIGN PATENT DOCUMENTS

| | | |
|---|---|---|
| JP | 2001-338699 | 12/2001 |
| JP | 2002-325363 | 11/2002 |
| JP | 2003-009406 | 1/2003 |
| JP | 2007-309943 | 11/2007 |
| JP | 2008-067523 | 3/2008 |

OTHER PUBLICATIONS

Japanese Office Action mailed Mar. 4, 2014.

* cited by examiner

ICAL FIELD

PORTABLE DEVICE, BATTERY PACK, DISPLAY CONTROLLING METHOD, AND DISPLAY CONTROLLING PROGRAM

TECHNICAL FIELD

The present invention generally relates to a portable device which is driven by a secondary battery which can be charged and discharged so as to execute plural applications, a battery pack, a display controlling method, and a display controlling program.

BACKGROUND ART

In recent years, portable devices driven by secondary batteries such as a lithium ion battery are popularly used along with a tendency of compactness of electronic devices. In order to avoid non-availability of such portable devices, a remaining battery level may be indicated on a display or the like. A user of the portable device uses the portable device while considering the remaining battery level with the indication and can charge the secondary battery at an appropriate timing. For example, Patent Document 1 discloses a secondary battery unit having a LDC display part on which a measured remaining battery level of a battery is indicated and a remaining battery level measuring method for a secondary battery.

[Patent Document 1] Japanese Laid-open Patent Publication No. 2007-309943

DISCLOSURE OF THE INVENTION

Problems to be Solved by the Invention

The secondary battery may deteriorate depending on a number of times of charge and discharge, an ambient temperature change, or the like. The capacity of the secondary battery decreases as degradation in the secondary battery proceeds. Therefore, when a degraded secondary battery is charged fully, an available time of the degraded secondary battery becomes shorter than a secondary battery which is not degraded. However, in the conventional portable device, only a remaining battery level relative to the full charge is indicated but information related to the degradation in the secondary battery is not indicated. Therefore, a user of the portable device cannot know about decrement of the remaining battery level caused by the degradation in the secondary battery. Although it is preferable to exchange a secondary battery depending on the state of deterioration. However, because information related to the deterioration of the secondary battery is not indicated by a user in the conventional portable device. Therefore, it is difficult for the user to exchange the secondary battery at an appropriate timing.

The present invention is provided to solve the above problem, and an object of the present invention is to provide a portable device, a battery pack, a display controlling method, and a display controlling program which enable a user to recognize a degradation status of a secondary battery of the portable device.

Means for Solving Problems

Accordingly, embodiments of the present invention may provide the following structure solving the problems discussed above.

There is provided a portable device driven by a secondary battery which is chargeable and dischargeable including a full charge detecting unit configured to detect a full charge of the secondary battery in receipt of a report of the full charge and to acquire capacity data indicative of a capacity of the secondary battery, a memory controlling unit configured to store the capacity data acquired by the full charge detecting unit in a memory unit, and a display control unit configured to cause a display unit of the portable device to display the capacity data stored by the memory controlling unit in chronological order.

The portable device may further include a setting unit configured to set a timing for acquiring the capacity data, wherein the full charge detecting unit acquires the capacity data at a timing set by the setting unit.

The portable device may further include a ratio calculating unit configured to calculate a ratio between an initial value of a capacity of the secondary battery and the capacity data, wherein the display control unit displays the capacity data along with the ratio.

The portable device may be formed such that the display control unit displays the initial value capacity data and the capacity data by associating the initial value capacity data and the capacity data for each capacity data, and displays a ratio between finally detected capacity data of the capacity data and the initial value independently from the associated initial value capacity data and capacity data for each capacity data.

The portable device may further include a residual quantity data acquiring unit configured to acquire residual quantity data indicative of a residual quantity of the secondary battery, wherein the display control unit displays the residual quantity data and the capacity data while associating the residual quantity data with the capacity data.

The portable device may be formed such that the display control unit displays the residual quantity data and finally acquired capacity data of the capacity data while associating the residual quantity data with the finally acquired capacity data.

There is provided a battery pack which is chargeable and dischargeable and drives a portable device including a full charge detecting unit detecting a full charge of a secondary battery in receipt of a report of the full charge and acquires capacity data indicative of a capacity of the secondary battery, a memory controlling unit storing the capacity data acquired by the full charge detecting unit in a memory unit, a display control unit causing a display unit of the portable device to display the capacity data stored by the memory controlling unit in chronological order, the battery pack including the secondary battery; and a secondary battery full charge detecting unit configured to detect the full charge of the secondary battery and calculates the capacity data of the secondary battery in the full charge, wherein the capacity data of the secondary battery calculated by the secondary battery full charge detecting unit are provided to the portable device.

The battery pack may further include a a setting unit configured to set a timing of acquiring the capacity data, wherein the secondary battery full charge detecting unit provides the capacity data to the portable device at a timing set by the setting unit.

There is provided a display control method using a portable device driven by a secondary battery which is chargeable and dischargeable, the display control method including detecting full charge of the secondary battery in receipt of a report of the full charge and acquiring capacity data indicative of a capacity of the secondary battery in the full charge, storing the capacity data acquired by the detecting the full charge unit in a memory unit, and displaying the capacity data stored by the storing the capacity data on a display unit included in the portable device in chronological order.

There is provided a display controlling program representing a sequence of instructions, the programs which when executed by a portable device driven by a chargeable and dischargeable secondary battery, the instructions cause the portable device to functions as detecting full charge of the secondary battery in receipt of a report of the full charge and acquiring capacity data indicative of a capacity of the secondary battery in the full charge, storing the capacity data acquired by the detecting the full charge unit in a memory unit, and displaying the capacity data stored by the storing the capacity data on a display unit included in the portable device in chronological order.

Effect of the Invention

According to the present invention, it is possible to make a user recognize a degradation condition of a secondary battery of a portable device.

BEST MODE FOR CARRYING OUT THE INVENTION

According to the present invention, the capacity of a second battery in a full charged state may be stored and indicated in chronological order. Thus, a user can recognize the degradation condition of the secondary battery.

Embodiment 1

Figure 1:
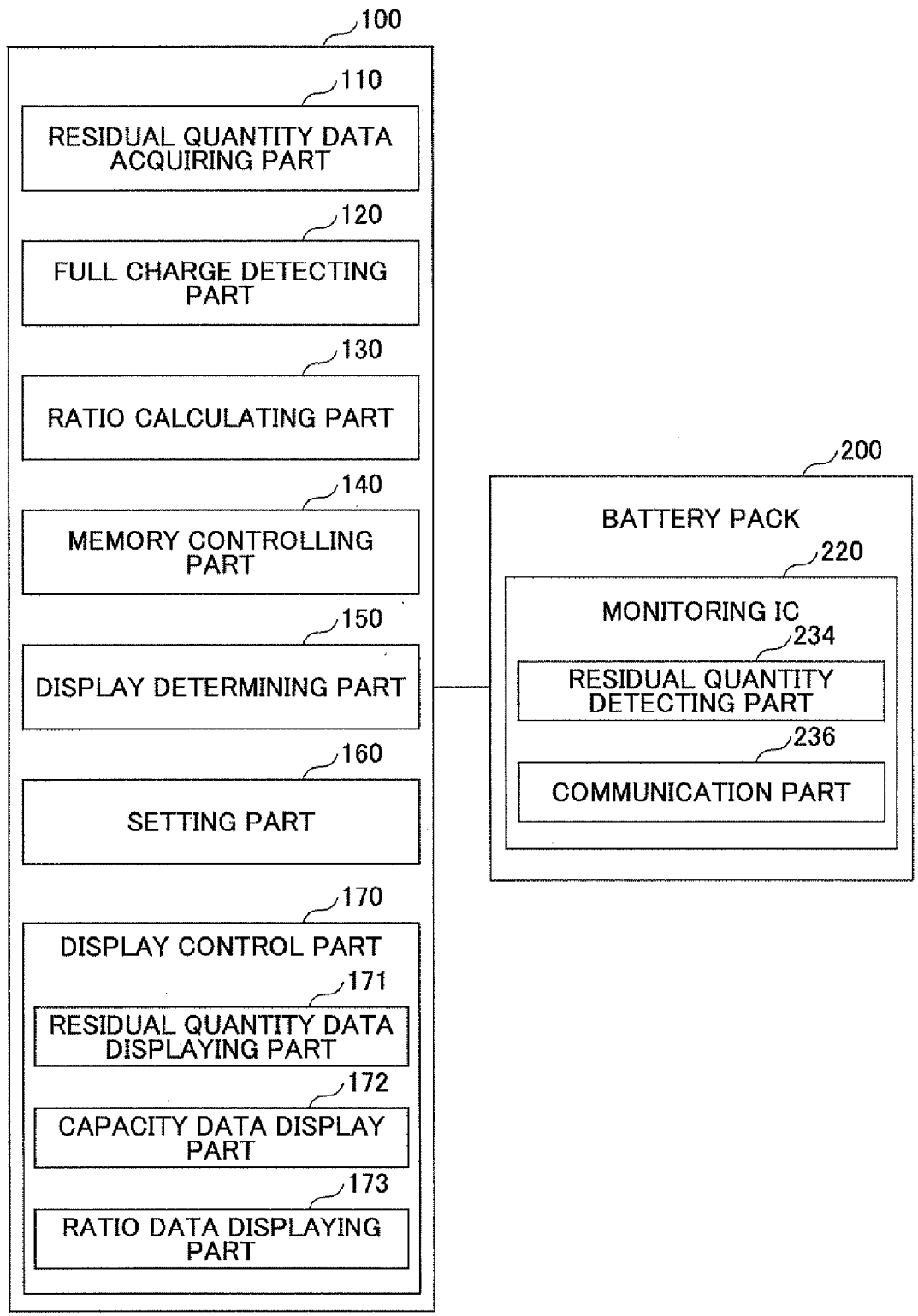
FIG. 1 illustrates a functional structure of a portable device of Embodiment 1.

Next, Embodiment 1 of the present invention is described in reference of figures. FIG. 1 illustrates a functional structure of a portable device of Embodiment 1.

A battery pack 200 is built in the portable device 100. The portable device 100 is driven by electricity supplied from the battery pack 200.

The battery pack 200 includes a monitoring IC 220 for monitoring a condition of a secondary battery installed inside the battery pack 200. The monitoring IC 220 includes a residual quantity detecting part 234 for detecting the remaining battery level of the secondary battery, and a communication part 236 for sending data detected by the monitoring IC 220. Detailed description of the battery pack 200 is given later.

The portable device 100 includes a residual quantity data acquiring part 110, a full charge detecting part 120, a ratio calculating part 130, a memory controlling part 140, a display determining part 150, a setting part 160, and a display control part 170.

The residual quantity data acquiring part 110 acquires the residual quantity data of the secondary battery from the residual quantity detecting part 234 of the monitoring IC 220. The full charge detecting part 120 detects an event in which the secondary battery is fully charged and acquires capacity data of the secondary battery in the event. The full charge detecting part 120 of Embodiment 1 detects the full charge based in a report which indicates the full charge and sent from, for example, the battery pack. The full charge detecting part 120 may detect the full charge after a passage of a predetermined time from a connection of the portable device 100 with a charging device. Capacity data in the full charged state acquired by the full charge detecting part 120 are calculated by a monitoring IC 220 or the like of the battery pack 200.

The ratio calculating part 130 calculates a ratio between a capacity data value in the full charged state and an initial value of the capacity data of the secondary battery described later. The memory controlling part 140 performs controls when various data are stored in a memory device.

The display determining part 150 determines whether the display control part 170 displays based on a previously provided setting. The detailed setting previously provided is described later. The setting part 160 carries out various settings to the portable device 100.

The display control part 170 controls the display in the display unit included in the portable device 100. The display control part 170 of Embodiment 1 mainly controls the display of the degradation condition of the secondary battery. The display control part 170 of Embodiment 1 includes a residual quantity data displaying part 171, a capacity data display part 172, and a ratio data displaying part 173. The residual quantity data displaying part 171 displays residual quantity data acquired by the residual quantity data acquiring part 110. The capacity data display part 172 displays the capacity data acquired by the full charge detecting part 120. The ratio data displaying part 173 displays a ratio calculated by the ratio calculating part 130.

Figure 2:
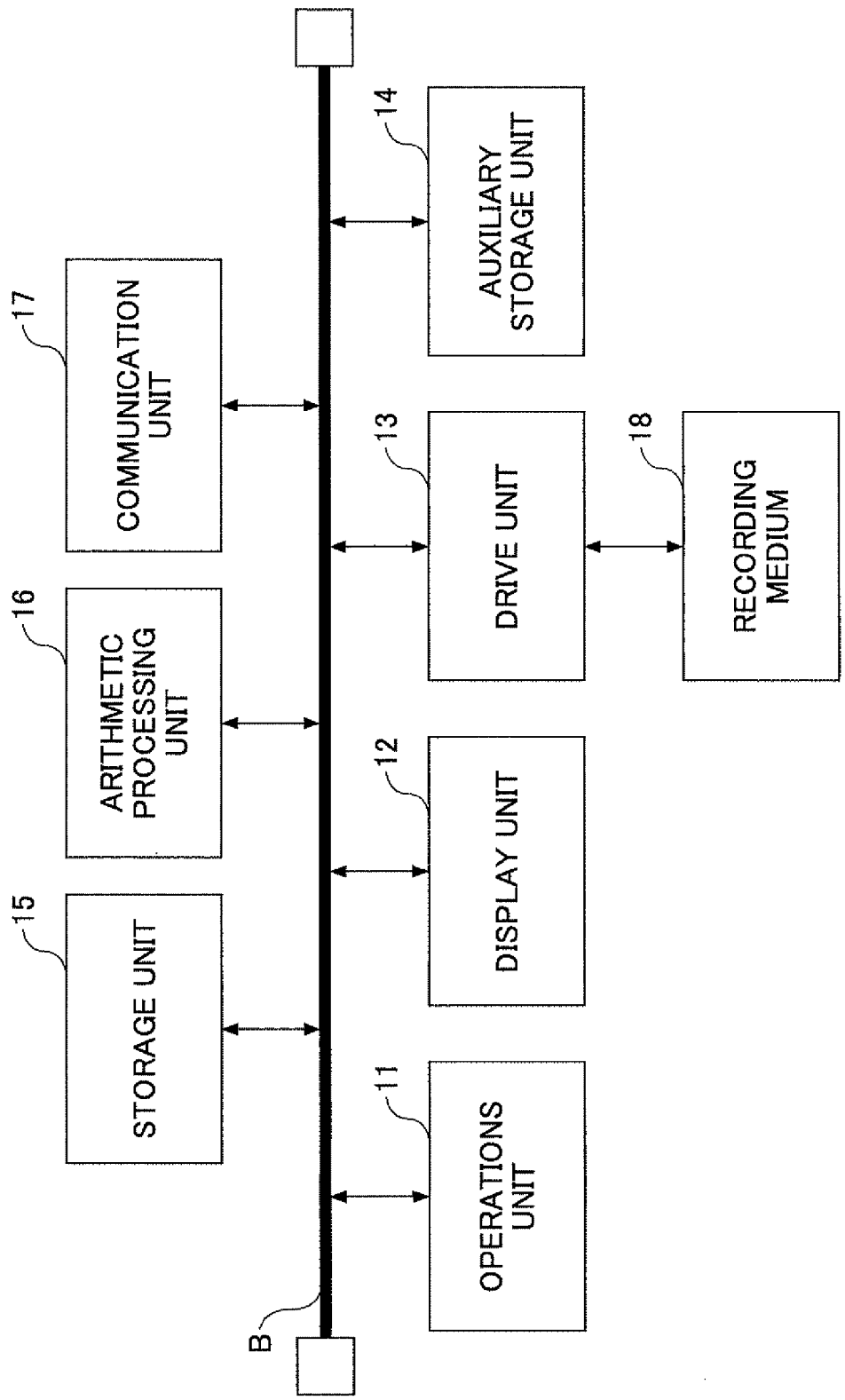
FIG. 2 illustrates an example hardware structure of the portable device of Embodiment 2.

FIG. 2 illustrates an example hardware structure of the portable device of Embodiment 2.

The portable device 100 includes an operations unit 11, a display unit 12, a drive unit 13, an auxiliary storage unit 14, a storage unit 15, an arithmetic processing unit 16, and a communication part 17. The portable device 100 is supplied with electricity from the battery pack 200 including the secondary battery (described below) and driven.

The operations unit 11 is provided to operate the portable device 100. Various signals for operating the portable device 100 are input via the operations unit 11. The operations unit 11 is specifically operation buttons such as a power key and numerical keypads. The display unit 12 is, for example, a liquid crystal display. A guide screen for guiding operations of the portable device 100, the progress of processes carried out in the portable device 100, and so on are displayed on the display unit 12. The communication part 17 is provided to enable the portable terminal 100 to communicate with other portable devices, base stations or the like. The communication part 17 may include an antenna installed in the portable device 100 and carries out a process or the like for sending and receiving data to and from an antenna.

The display controlling program of the present invention is at least a part of the various programs controlling the portable device 100. The display controlling program is served by a delivery of the recording medium 18, a receipt via the communication part 17, or the like. The recording medium 18 recording the display controlling program is a recording medium which can be readable by a portable device 100 such as a memory card.

When the recording medium 18 on which a display controlling program is recorded is installed in the drive unit 13, the display controlling program is installed in the auxiliary storage unit 14 via the drive unit 13 from the recording medium 18. The display controlling program received via the communication part 17 is installed in the auxiliary storage unit 14.

Figure 3:
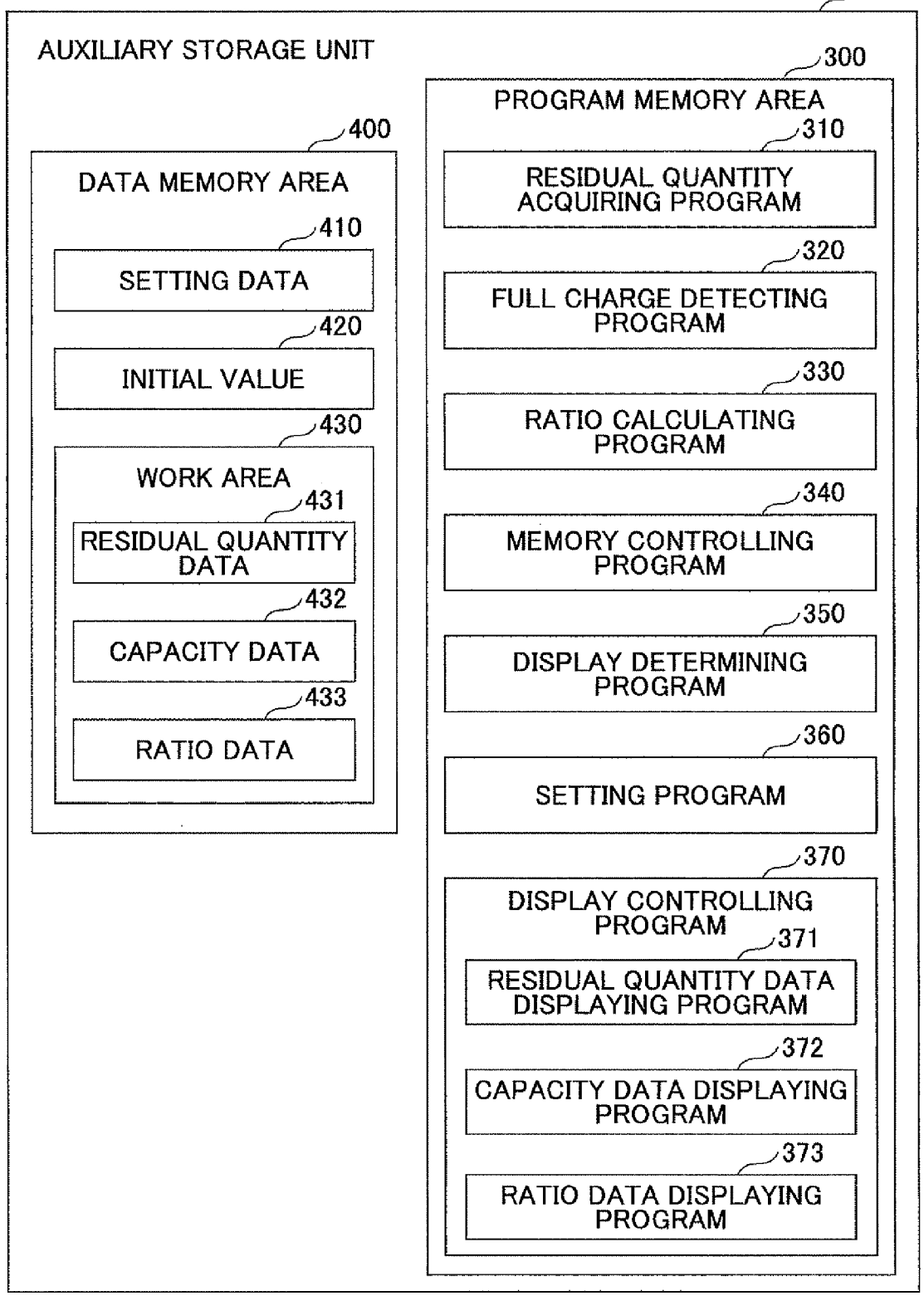
FIG. 3 explains a memory area of an auxiliary storage unit of Embodiment 1.

The auxiliary storage unit 14 has a program memory area in which various programs are stored and a data memory area in which various data are stored as illustrated in FIG. 3. The auxiliary storage unit 14 stores not only the installed display controlling program but also necessary files and data. The storage unit 15 reads various programs stored in the program memory area of the auxiliary storage unit 14 when the portable device 100 is started and deploys the various programs. The arithmetic processing unit 16 realizes various processes described later in conformity with the display controlling program deployed in the storage unit 15.

FIG. 3 explains a memory area of an auxiliary storage unit of Embodiment 1.

The auxiliary storage unit 14 includes the program memory area 300 and the data memory area 400. Various programs for operating the portable device 100 of Embodiment 1 are stored in the program memory area 300. Data obtained by executing the various programs, which are stored in the program memory area 300, or the like are stored in the data memory area 400.

The program memory area 300 stores a residual quantity acquiring program 300 working as a residual quantity data acquiring part 110, a full charge detecting program 320 working as the full charge detecting part 120, a ratio calculating program 330 working as the ratio calculating part 130, a memory controlling program 340 working as the memory controlling part 140, a display determining program 350 working as the display determining part 150, a setting program 360 working as the setting part 160, and a display controlling program 370 working as the display control part 170.

The display controlling program 370 includes a residual quantity data displaying program 371 working as the residual quantity data displaying part 171, a capacity data displaying program 372 working as the capacity data display part 172, and a ratio data displaying program 373 working as the ratio data displaying part 173.

The data memory area 400 of Embodiment 1 stores setting data 410 and an initial value 420. The setting data 410 are various setting data previously stored in the portable device 100 by the setting part 160. The initial value 420 is the full charged capacity value of the secondary battery built in the portable device 100 before the secondary battery is degraded. Said differently, an initial value 420 is the full charged capacity value of a non-used secondary battery. The initial value 420 may be previously installed in the portable device 100 before the portable device 100 is shipped.

Figure 4:
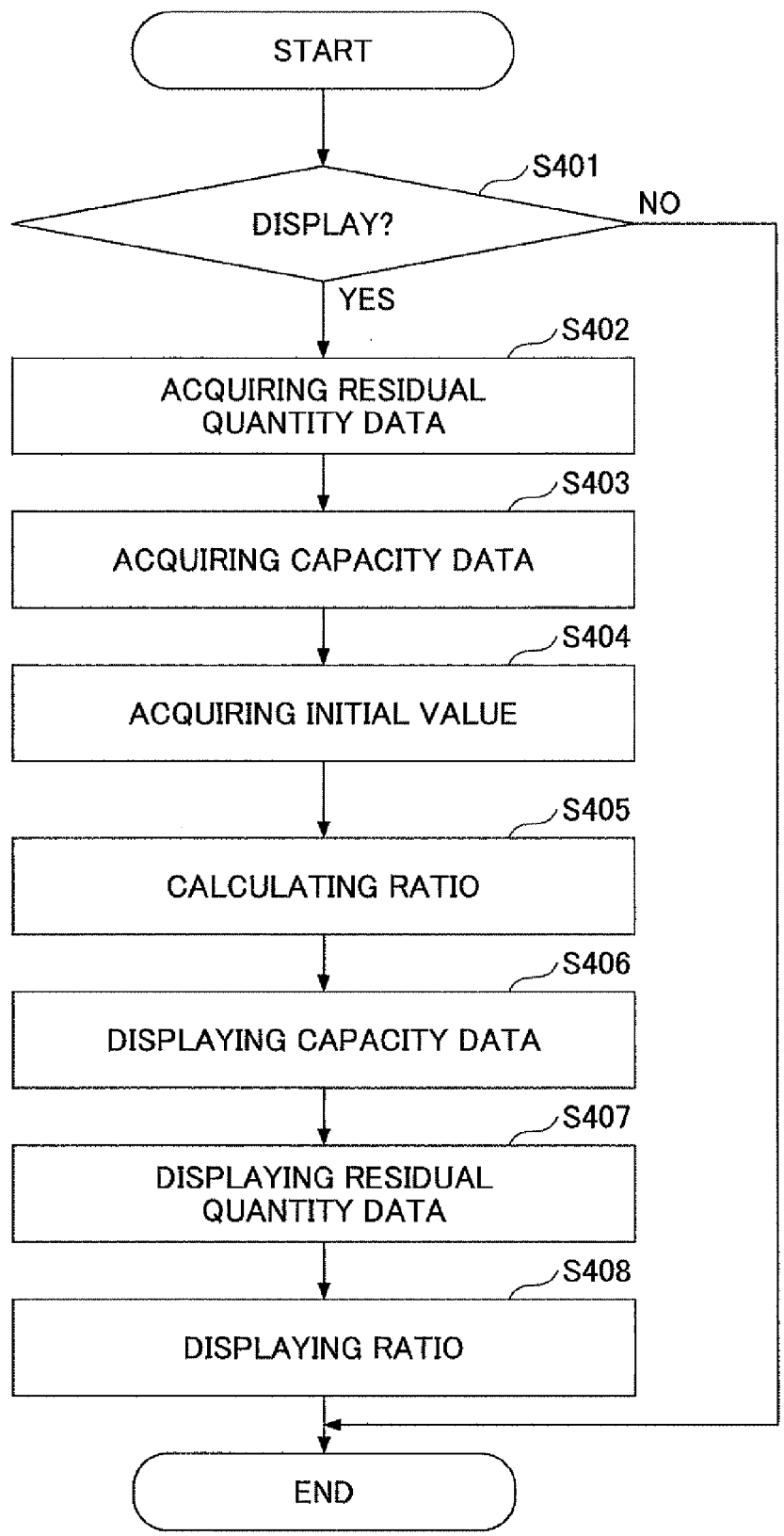
FIG. 4 is a flowchart illustrating a display control process of the portable device of Embodiment 1.

The data memory area 400 further includes a work area 430. Execution results of the various programs, which are stored in the program memory area 300, are temporally stored in the working area 430. The work area 430 of Embodiment 1 includes residual quantity data 431 acquired by the residual quantity data acquiring part 110 where capacity data 432 detected by the full charge detecting part 120, ratio data 433 calculated by the ratio calculating part 130, and so on are temporally stored. Next, the portable device 100 of Embodiment 1 is described in reference of FIG. 4. FIG. 4 is a flowchart illustrating a display control process of the portable device of Embodiment 1.

The display determining part 150 of the portable device 100 determines whether the degradation condition of the secondary battery is displayed in step S401. For example, the display determining part 150 displays the degradation condition when the setting data 410 of the data memory area 400 are set so as to display the degradation condition of the secondary battery.

When it is determined that the degradation condition of the secondary battery is displayed by the display determining part 150, the residual quantity data acquiring part 110 acquires the residual quantity data of the secondary battery from the monitoring IC 220 of the battery pack 200 in step S402. The residual quantity data are temporally stored as the residual quantity data 431 in the work area 430 by the memory controlling part 140.

When the residual quantity data 431 are acquired, the capacity data display part 172 acquires the capacity data 432 which are acquired by the full charge detecting part 120 and stored in the work area 430 by the memory controlling part 140 in step S403.

The acquisition of the capacity data 432 with the full charge detecting unit 120 is described. The full charge detecting part 120 acquires the capacity data of the secondary battery when the full charge is detected based on the setting data 410 and the setting part 160. The acquired capacity data are stored as the capacity data 432 in the work area 430 by the memory controlling part 140.

For example, when the capacity data are acquired each time the full charge is detected, the full charge detecting part 120 acquires the capacity data in the full charged state, and the memory controlling part 140 stores the acquired capacity data 432 of the work area 430. At this time, the full charge detecting part 120 preferably acquires information (hereinafter, referred to as time data) indicative of a time when the full charge is detected in association with the capacity data 432. It is preferable that the acquired time data are stored in association with the capacity data 423 by the memory controlling part 140. Therefore, the capacity data stored in the work area 430 include plural capacity data associated with the time data.

Further, when the capacity data are acquired for each week by the capacity data 410, the full charge detecting part 120 acquires the capacity data 432 once a week at the time of detecting the full charge. The acquired capacity data is stored in the work area 430 by the memory controlling part 140. The full charge detecting part 120 acquires the time data in synchronism with the acquisition of the capacity data 432. The memory controlling part 140 stores the capacity data and the time data by associating the capacity data with the time data. The full charge detecting part 120 may not acquire the capacity data when the full charge is detected in a case where the acquisition of the capacity data 432 is unnecessary (e.g., one day after a day when the capacity data are acquired). The memory controlling part may acquire the capacity data and may not store the capacity data with the memory controlling part 140.

When the capacity data 432 of the full charged state are acquired, the ratio calculating part 130 acquires the initial value 420 from the data memory area 400 in step S404. The ratio calculating part 130 calculates a ratio between the capacity data 432 in the full charged state acquired in step S403 and the initial value acquired in step S404 in step S405. The calculated ratio is temporally stored as ratio data 433 of the work area 430 in the memory controlling part 140.

Hereinafter, the process of the ratio calculating part 130 of Embodiment 1 is described. The ratio calculating part 130 of Embodiment 1 calculates a percentage of the capacity data 432 relative to the initial value 420 as the ratio between the capacity data 432 and the initial value 420. By calculating the percentage, it is possible to recognize what degree the capacity data 432 of the full charged state decreases in comparison with the capacity data of the secondary battery before the degradation. Thus, it is possible to recognize the degree of degradation in the secondary battery.

The ratio calculating part 130 calculates the ratio between plural capacity data included in the capacity data 432 and the initial value 420 based on the setting data 410. The ratio calculating part 130 may calculate the ratio at a timing set in the setting data 410 apart from the detection of the full charge.

When the setting data 410 is set to store the capacity data for each full charge and calculate the ratio between the capacity data 432 of each month and the initial value 420, the ratio calculating part 130 may calculate a ratio between the first detected capacity data 432 for each month and the initial value 420. In the above setting, the ratio calculating part 130 may calculate an average value of the capacity data 432 for each month and a ratio between the average value and the initial value 420 may be calculated.

When the ratio is calculated by the ratio calculating part 130, the capacity data display part 172 of the display control part 170 causes the display unit 12 to display the capacity data acquired in step S403, in step S406. Next, the residual quantity data displaying part 171 of the display control part 170 causes the residual quantity data 431 acquired in step S402 to display on the display unit 12 in step S407. At this time, the residual quantity data 431 are preferably displayed in association with the capacity data 432 acquired at a time closest to a time when the residual quantity data 431 are acquired. For example, when the capacity data 432 are set to be acquired for each month, the residual quantity data 431 are preferably displayed in association with the capacity data 432 which are acquired on the month to which the day when the residual quantity data 431 are acquired belongs.

Next, the ratio data displaying part 173 of the display control part 170 causes the ratio data 433 calculated in step S405 to be displayed on the display unit 12 in step S408. Thus, the display process ends. With Embodiment 1, the ratio data 433 are displayed using percentage. However, the present invention is not limited thereto. For example, the ratio calculating part 130 may display a ratio of the capacity data 432 relative to the initial value 420. The ratio data displaying part 173 may display a message or the like indicative of the degree of degradation in the secondary battery based on the calculated ratio.

In step S401, the display determining part 150 has been described as determining the display when the degradation condition of the secondary battery is set to be displayed. However, the present invention is not limited to this configuration. For example, when the degradation condition is set to be displayed for each predetermined period, the display determining part 150 of Embodiment 1 may periodically determine the processes of step S402 to step S408 based on the setting. Further, the display determining part 150 monitors the value of the capacity data which are acquired by the full charge detecting part 120. When the value of the capacity data become smaller by a predetermined value or more in comparison with the capacity data detected in the previous full charged state, the degradation condition may be displayed as the error of the secondary battery. The predetermined value may be stored in the data memory area 400 as a set value contained in the setting data 410.

Figure 5:
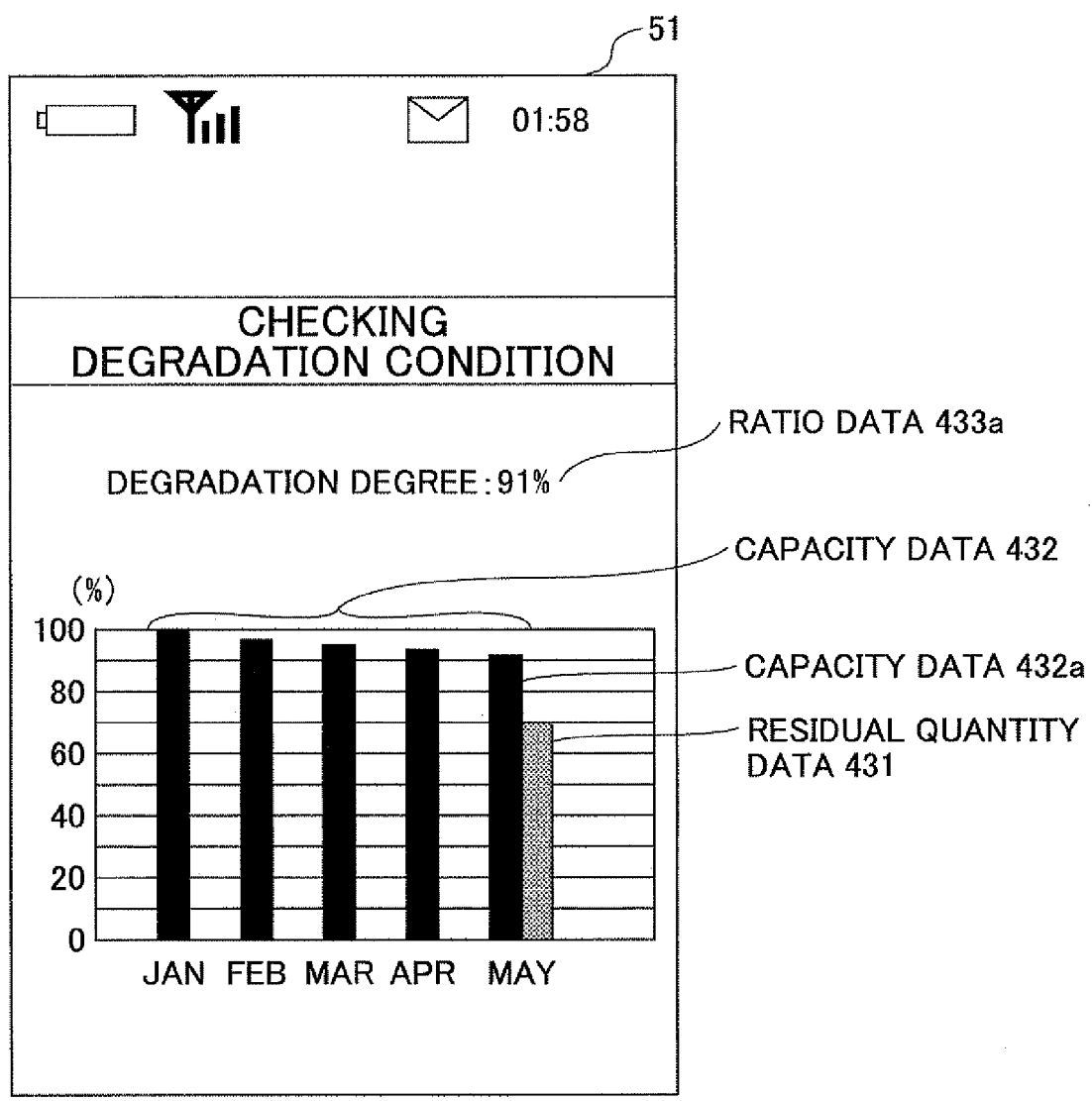
FIG. 5 is a display example of degradation condition of a secondary battery in the portable device of Embodiment 1.

FIG. 5 is a display example of a degradation condition of a secondary battery in the portable device of Embodiment 1.

FIG. 5 is an example of the screen 51 on which the degradation condition of the secondary battery is displayed in the display unit 12. The display control part 170 of Embodiment 1 is driven by the capacity data display part 172 to display a bar graph of the ratio of the capacity data 432 relative to the initial value 420 (the initial value is 100%) for each month. In the bar graph, the axis of ordinate indicates percentage (%) and the axis of abscissas indicates a time (a unit of month) In the bar graph, the ratios of the capacity data 432 relative to the initial value 420 are displayed based on the capacity data 432 stored in the work area 430 and the ratio data 433 calculated based on the capacity data 432. With Embodiment 1, a transition of the capacity data along with the passage of time is displayed to enable a user to recognize the passage of the degradation in the secondary battery. With Embodiment 1, because the bar graph is displayed based on the capacity data 432 and the ratio data 433, it is possible to display the transition of the capacity data for each month relative to the initial value 420. Therefore, it is possible to make the user recognize the progress of the degradation in the secondary battery.

The display control part 170 of Embodiment 1 displays, with the residual quantity data displaying part, the residual quantity data 431 so as to partly overlap capacity data 432a (capacity data C) acquired at a time closest to the time when the residual quantity data 431 are acquired. The capacity data 432a (capacity data C) may be that most recently acquired. Therefore, on the screen 51, it is possible to recognize that the residual quantity data 431 of the secondary battery are associated with the capacity data 432a at a time of displaying the screen 51. Thus, it is possible to make the user recognize the residual quantity data 431 relative to the capacity data 432a.

Further, the display control unit 170 of Embodiment 1 makes the ratio data 433a, calculated based on the finally acquired capacity data 432a, display with the ratio data displaying part 173. The finally calculated ratio data 433a are displayed as data indicative of the current degree of the degradation progress in the secondary battery. With Embodiment 1, by displaying the ratio data 433a calculated based on the most new capacity data 432a independent from the bar graph, it is possible for the user to recognize the current status of the degradation in the secondary battery.

Further, the ratio data displaying part 173 of Embodiment 1 may display the ratio data 433a using, for example, red, when the ratio data 433a becomes smaller than the predetermined value. Further, the ratio data displaying part 173 may display the ratio data 433a using bold or larger font when the ratio data 433a becomes smaller than the predetermined value. Further, the ratio data displaying part 173 may display a message prompting an exchange of the secondary battery together with the ratio data 433a when the ratio data 433a become smaller than the predetermined value. The predetermined value of the ratio data 433a is preferable stored in the data memory area 400 as the set value included in the setting data 410.

With Embodiment 1, the capacity data 432 are described as being stored in the data memory area 400 inside the auxiliary storage unit 14 of the portable device 100. The capacity data 432 or the like may be stored in a recording medium from which the portable device 100 is readable. The recording medium readable by the portable device 100 may be an SD memory card, a Subscriber Identity Module (SIM) card, or the like.

With Embodiment 1, by displaying the capacity data acquired in the full charged state of the secondary battery in chronological order, it is possible to make the user recognize the degradation condition of the secondary battery. Further, by displaying the capacity data using the bar graph or the like, it is possible to make the user visually recognize the degradation condition of the secondary battery. Furthermore, by independently displaying the ratio data calculated based on the capacity data in the full charged state which was most recently acquired, the user can recognize the degradation condition of the secondary battery.

With Embodiment 1, there has been described that the capacity data 432 are displayed as the bar graph by the capacity data display part 172. However, the present invention is not limited thereto. The capacity data display part 172 may use a sequential line graph in order to indicate a change of the capacity data 432. The capacity data display part 172 may use other graphs in order to indicate the change of the capacity data 432. The capacity data display part 172 may use any other measure in order to indicate the change of the capacity data 432.

Figure 6:
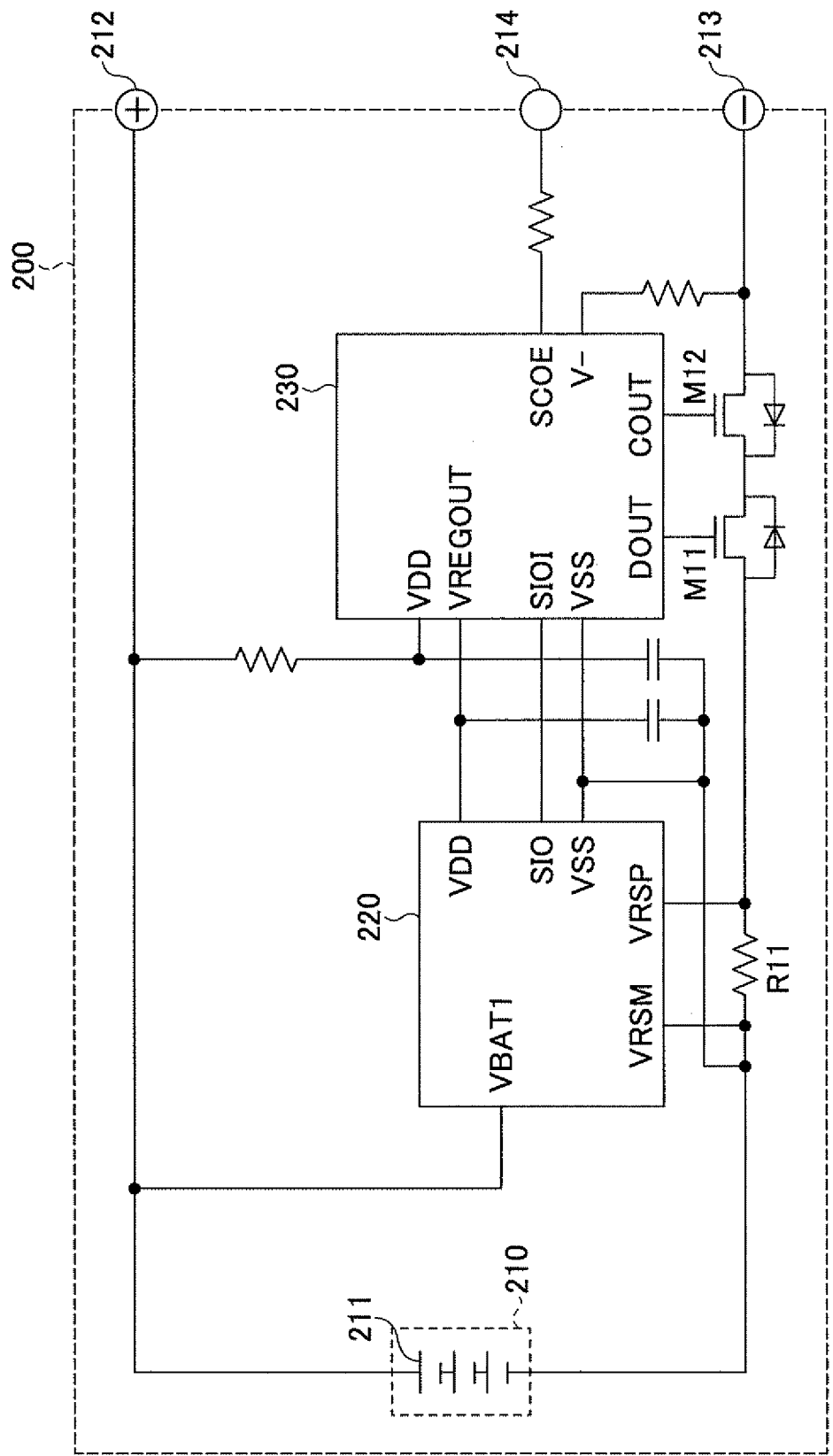
FIG. 6 illustrates a battery pack installed in a portable device of Embodiment 1.
Figure 7:
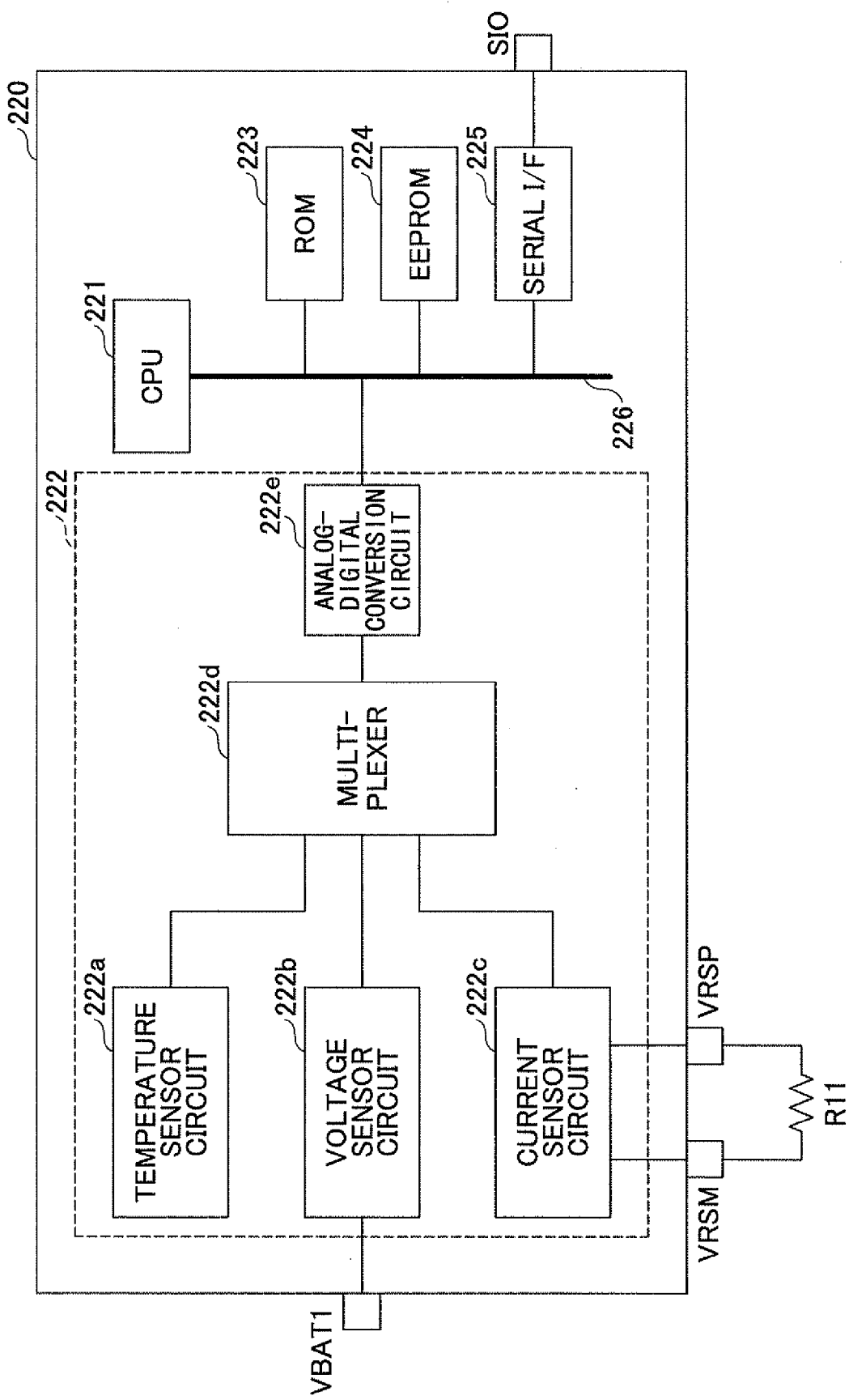
FIG. 7 illustrates a hardware structure of a monitoring IC of Embodiment 1.
Figure 8:
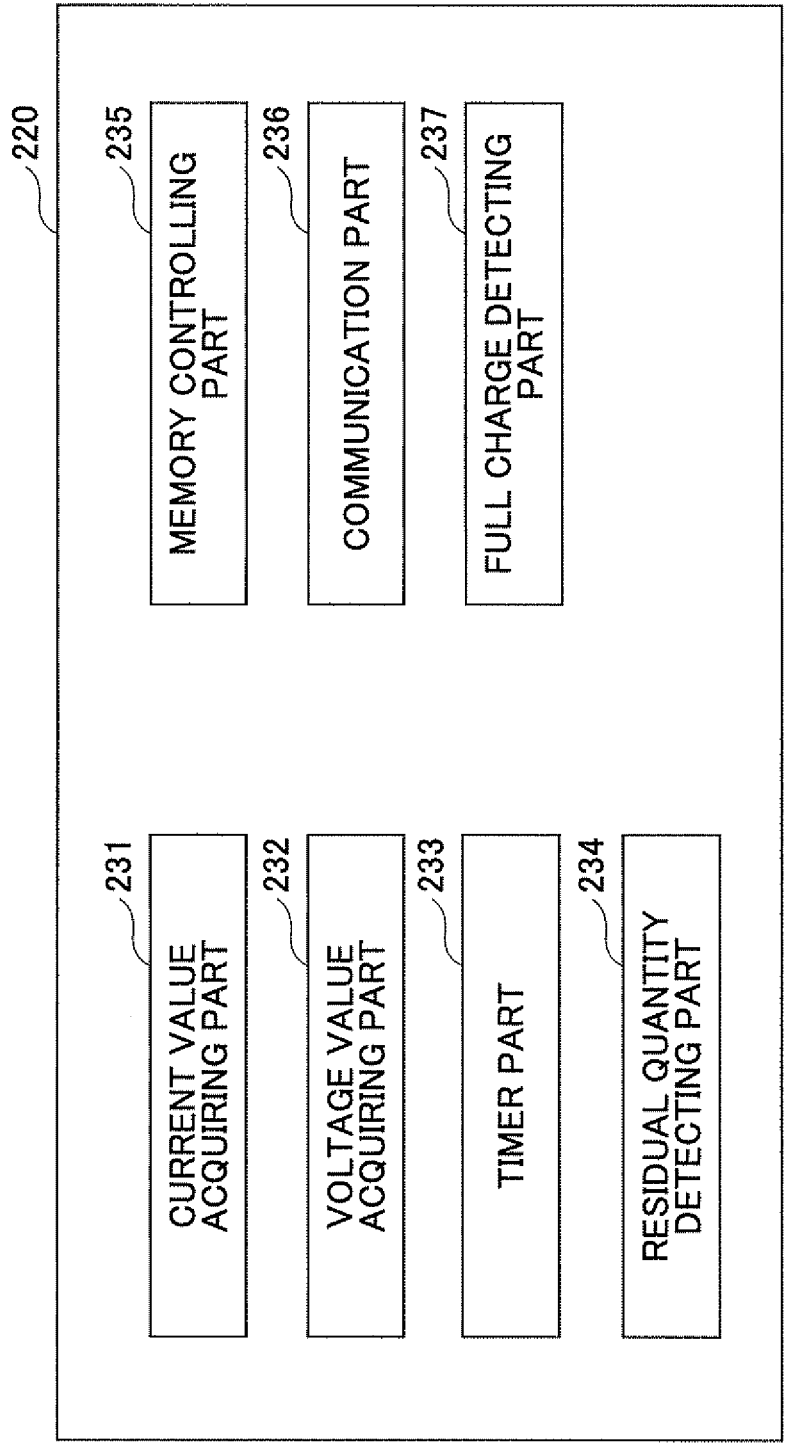
FIG. 8 illustrates a functional structure of the monitoring IC of Embodiment 1.

Referring to FIG. 6 to FIG. 8, the battery pack 200 built in the portable device 100 of Embodiment 1 is described.

FIG. 6 illustrates a battery pack installed in a portable device of Embodiment 1.

The battery pack 200 includes a battery unit 210 which is formed by connecting plural secondary batteries 211 such as a lithium-ion battery. With Embodiment 1, the battery unit 210 is formed by serially connecting the secondary batteries. However, the present invention is not limited thereto.

The battery pack 200 includes a positive terminal 212 and a negative terminal 213, which are provided to connect the portable device 100, in which the battery pack 200 is installed, the battery unit 210, and a monitoring IC 220 and a protection IC 230 which are provided between the battery unit 210 and the positive and negative terminals 212 and 213.

The monitoring IC 220 monitors a status of the battery unit 210 and acquires status information of the battery unit 210. When the monitoring IC 220 receives a request of referring the status information from the portable device 100, the acquired status information is given to the portable device 100.

The monitoring IC 220 includes a power terminal VDD, a reference potential terminal VSS, a voltage detecting terminal VBAT1, a pair of current detecting terminals VRSP and VRSM, and a communication terminal SIO. The power terminal VDD of the monitoring IC 220 receives a voltage obtained by regulating a voltage from a power source by the protection IC 230. The reference potential terminal VSS is connected to the cathode of the battery unit 210.

The monitoring IC 220 can detect the output voltage of the battery unit 210 via the voltage detecting terminal VBAT1 connected to the anode of the battery unit 210. The other current detecting terminal VRSM is connected to the cathode of the secondary battery 211 and further connected to the other current detecting terminal VRSP via a resistor R11 outside the monitoring IC 220.

The monitoring IC 220 detects the current flowing through the external resistor R11 via the current detecting terminals VRSP and VRSM, i.e., charge and discharge currents of the battery unit 210. The communication terminal. SIO is connected to the external terminal 214 used for communicating with the portable device 100 via the protection IC 230. The monitoring IC 220 communicates with the portable device 100 via the communication terminal SIO and the protection IC 230. The monitoring IC is described in detail later.

The protection IC 230 protects the battery pack 200 from the over-charge and the over-discharge. The protection IC 230 includes a terminal DOUT and a terminal COUT connected to the gates of MOS transistors M11 and M12, which shut down the charge and discharge of the battery pack, respectively. The protection IC 230 shuts down the MOS transistor M11 using the DOUT output at a time of detecting the over-discharge or over current as a low level. The protection IC 230 shut down the MOS transistor M12 using the COUT output at a time of detecting the over-charge as a low level.

Referring to FIG. 7 and FIG. 8, the monitoring IC 220 is described in detail. FIG. 7 illustrates a hardware structure of the monitoring IC of Embodiment 1. Referring to FIG. 7, the monitoring IC 220 includes a Central Processing Unit (CPU) 221, a sensor part 222, a Read Only Memory (ROM) 223, an Electrically Erasable and Programmable ROM (EEPROM) 224, and a serial I/F 225. The CPU 221 controls various portions of the monitoring IC 220. The sensor part 222 detects the voltage, current and temperature of the battery unit 210. The ROM 223 stores the program executed by the CPU 221 for controlling the various portions of the monitoring IC 220. The EEPROM 224 stores information of the various parameters of the voltage, current and temperature of the battery unit 210, which are detected by the sensor part 222. The serial I/F 225 communicates with the portable device 100 via the communication terminal SIO. The CPU 221, the sensor part 222, the ROM 223, the EEPROM 224 and the serial I/F 225 are connected via a bus 226. Data and programs are exchanged among the CPU 221, the sensor part 222, the ROM 223, the EEPROM 224 and the serial I/F 225.

The sensor part 222 includes a temperature sensor circuit 222a, a voltage sensor circuit 222b, a current sensor circuit 222c, a multiplexer 222d, and an analog-digital (A/D) conversion circuit 222e.

The temperature sensor circuit 222a detects the temperature of the battery unit 210. The voltage sensor circuit 222b detects the output voltage of the battery unit 210 via the voltage detecting terminal VBAT1 connected to the battery unit 210. The current sensor circuit 222c detects the current flowing through the external resistor R11 via the current detecting terminals VRSP and VRSM, i.e., the charge and discharge currents of the battery unit 210. Outputs from the temperature sensor circuit 222a, the voltage sensor circuit 222b, and the current sensor circuit 222c are connected to the multiplexer 222d. These outputs are output as one signal by the multiplexer 222d. The A/D conversion circuit 222e converts the output signal output by the multiplexer 222d from analogue to digital.

FIG. 8 illustrates a functional structure of the monitoring IC of Embodiment 1. With Embodiment 1, the functional structure of the monitoring IC 220 illustrated in FIG. 8 is realized by a specific program stored in the ROM 223 illustrated in FIG. 7.

The monitoring IC 220 includes a current value acquiring part 231, a voltage value acquiring part 2332, a timer part 233, a residual quantity detecting part 234, a memory controlling part 235, a communication part 236, and a full charge detecting part 237.

The current value acquiring part 231 acquires a current value detected by the current sensor circuit 222c. The current value acquiring part 232 acquires a current value detected by the voltage sensor circuit 222b. The timer part 233 counts the time by a clock function built in the monitoring IC 220.

The residual quantity detecting part 234 detects a residual quantity of the battery unit 210 as residual quantity data using the current value acquired by the current value acquiring part 231, the voltage value acquired by the voltage value acquiring part 232, and the clock function of the timer part 233.

The memory controlling part 235 may make the EEPROM 224 store the current value acquired by the current value acquiring part 231, the voltage value acquired by the voltage value acquiring part 232, and the status information such as the residual quantity detected by the residual quantity detecting part 234. The communication unit 236 communicates with the portable device 100 in which the battery pack 200 is built in. For example, the communication part 236 provides the residual quantity data indicative of the residual quantity of the battery unit 210 or the like to the portable device 100.

The full charge detecting part 237 detects the full charge of the secondary battery 211 forming the battery unit 210 based on the current value acquired by the current value acquiring part 231, the voltage value acquired by the voltage value acquiring part 232, or the like. The full charge detecting part 237 may calculate a capacity value of the secondary battery in the full charged state based on the current value, the voltage value, the temperature of the battery unit 210 which is detected by the temperature sensor 222a, or the like. When the full charge is detected by the full charge detecting part 237, the communication part 236 may report the full charge to the portable device 100. The communication part 236 may provide the capacity value of the battery unit 210 which is calculated by the full charge detecting part 237 to the portable device 100 as the capacity data.

The portable device 100 can detect the full charge of the secondary battery 211 by building in the battery pack 200 having the monitoring IC 220 constructed as described above. The portable device 100 may acquire the capacity data in the full charged state from the monitoring IC 220. Therefore, it is possible to make the user visually recognize the degradation condition of the secondary battery 211 of the portable device 100 by displaying the change of the capacity data in the full charged state in chronological order.

Embodiment 1 is applicable to devices which are driven by secondary batteries such as a portable phone, a digital camera, a notebook computer, a portable music playback device, a portable game device, and a portable television device.

Embodiment 2

Next, Embodiment 2 of the present invention is described in reference of figures. With Embodiment 2, a use history of a second battery 211 forming a battery unit 210 is displayed on a display unit 12. With Embodiment 2, only portions different from Embodiment 1 are described. Reference symbols are used for portions the same as those of Embodiment 1, and description of these portions are omitted.

The use history of the secondary battery 211 in Embodiment 1 indicates how the secondary battery is consumed. The use history of the secondary battery 211 in Embodiment 2 is indicated by a type of an executed application, an execution time or an execution quantity of the executed application, and so on.

With Embodiment 2, the use history of the secondary battery 211 is displayed. Therefore, it is possible to recognize the use history of the secondary battery 211 when a failure of the secondary battery occurs. The use history could not have been analyzed with conventional techniques. By recognizing the use history of the secondary battery 211, it is also possible to find a reason why the failure of the secondary battery 211 occurs or the like. By indicating the use history of the secondary battery, it is possible to recognize an extent to which the secondary battery 211 is used. Thus, it is possible to know a degree of degradation of the secondary battery 211.

Figure 9:
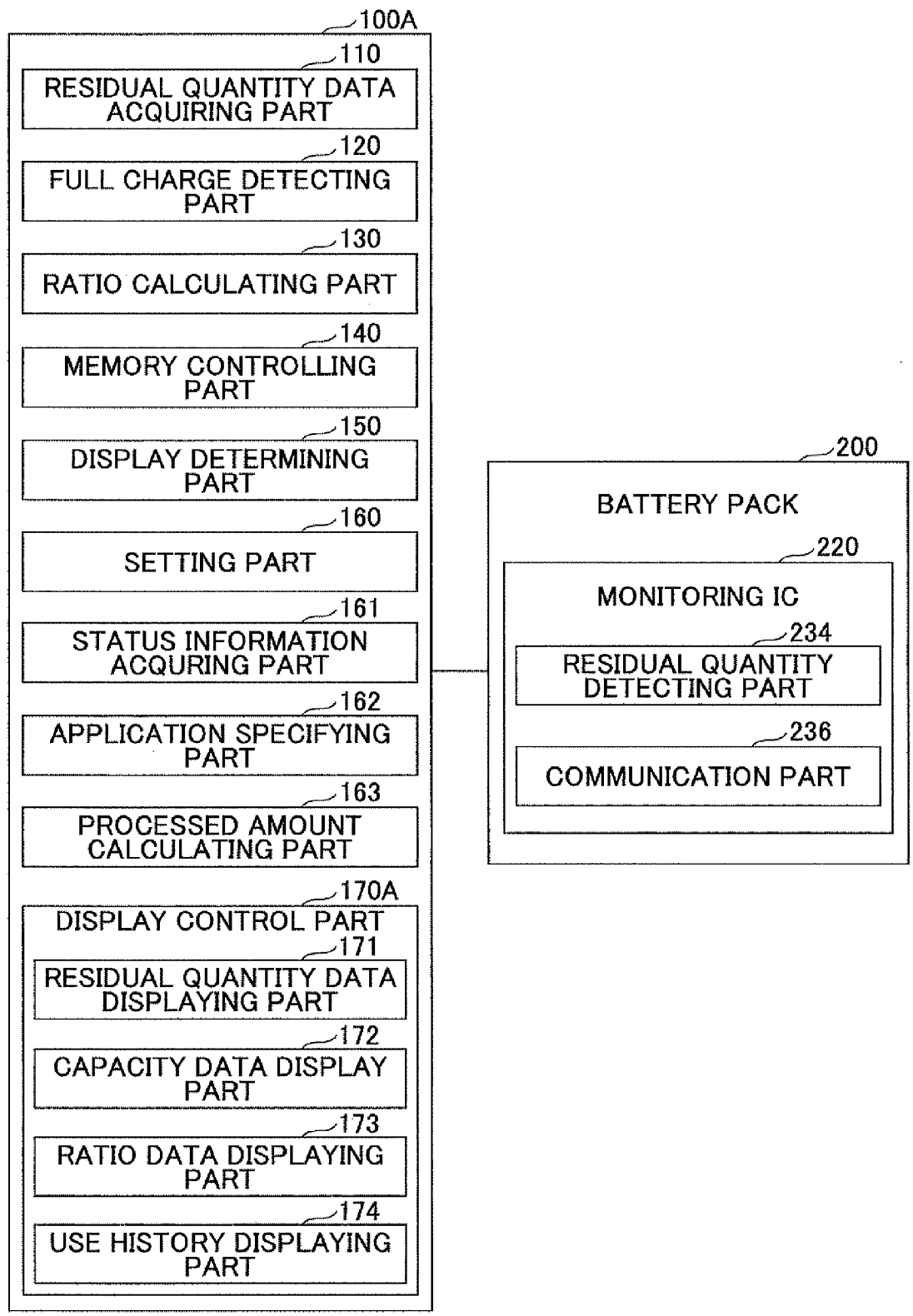
FIG. 9 illustrates a functional structure of a portable device of Embodiment 2.

FIG. 9 illustrates a functional structure of the portable device of Embodiment 2. The portable device 100A of Embodiment 2 includes a status information acquiring part 161, an application specifying part 162, and a processed amount calculating part 163 in addition to various portions of the portable device 100 of Embodiment 2. The display control part 170A included in the portable device 100A of Embodiment 2 includes a use history displaying part 174 in addition to the various portions of the display control part 170 of Embodiment 2.

The status information acquiring part 161 acquires status information of the secondary battery 211 from the memory controlling part 235 built in the battery pack 200.

The application specifying part 162 specifies the application executed by the portable device 100A based on the status information. The processed amount calculating part 163 calculates a processed amount of the specified application. For example, the processed amount of the application is indicated by duration of call when the application realizes a call function and by the number of sent and received mails when the application realizes a mail sending and receiving function. A detailed description of processes with the application specifying part 162 and the processed amount calculating part 163 are given later in detail.

The use history displaying part 174 included in the display control part 170A makes the display unit 12 indicate the processes amount calculated by the processed amount calculating part 163 for each specified application specified by the application specifying part 162.

Figure 10:
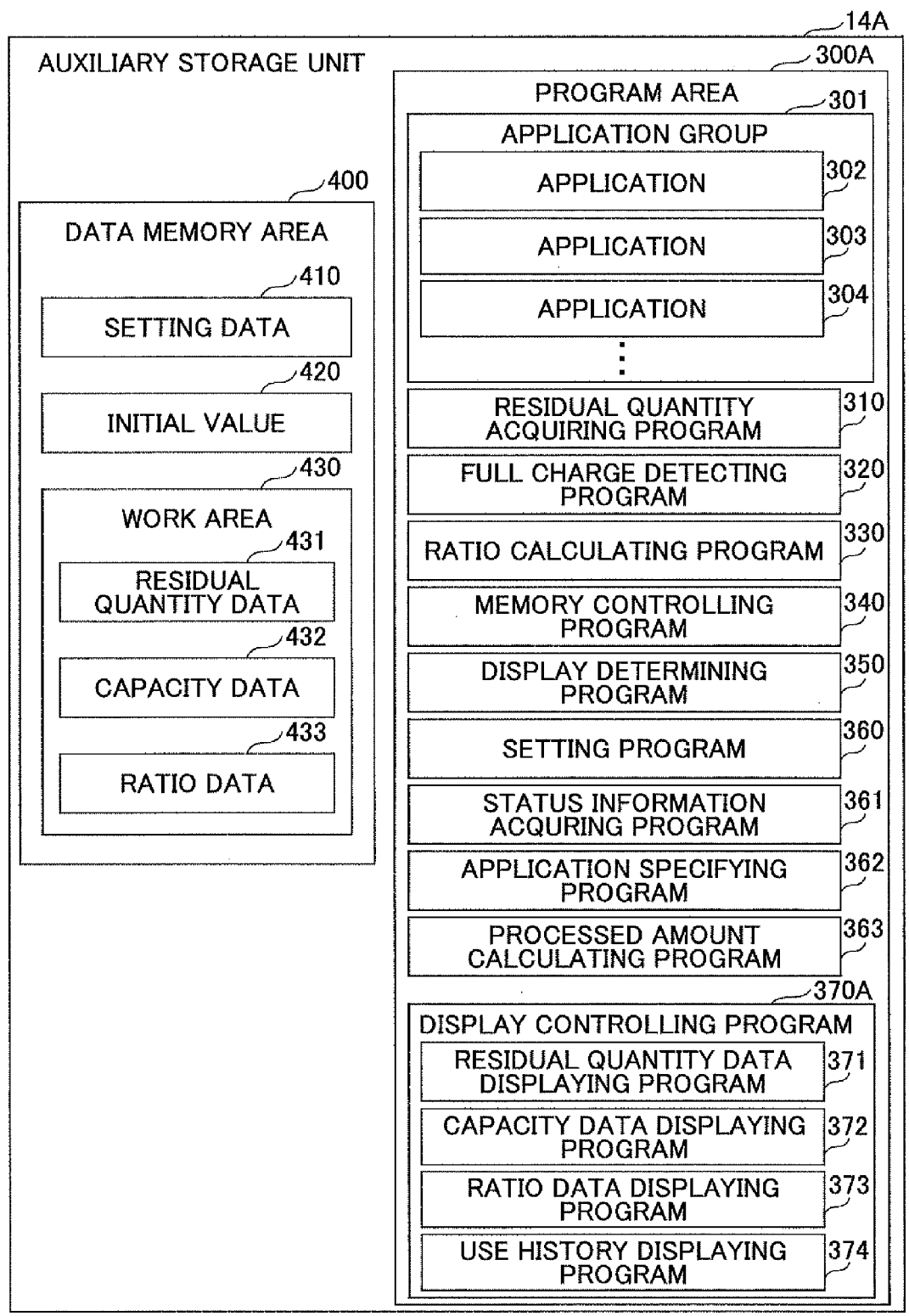
FIG. 10 explains a memory area of an auxiliary storage unit of Embodiment 2.

FIG. 10 explains a memory area of an auxiliary storage unit of Embodiment 2.

An application group 301 is stored in a program area 300A of the auxiliary storage unit 14A of Embodiment 2. The application group 301 is formed by plural applications installed in the portable device 100A. Plural applications 301 forming the application group 302 may be an application realizing a call function, an application 303 realizing a sending and receiving function of emails, an application 304 realizing a music playback function, and so on.

The program area 300A of the auxiliary storage unit 14A stores a status information acquiring program 361 functioning as the status information acquiring part 161, an application specifying program 362 functioning as the application specifying part 162, and a processed amount calculating program 363 functioning as the processed amount calculating part 163. A use history displaying program 374 functioning as the use history displaying part 174 is stored in a display controlling program 370A of the program area 300A.

Figure 11:
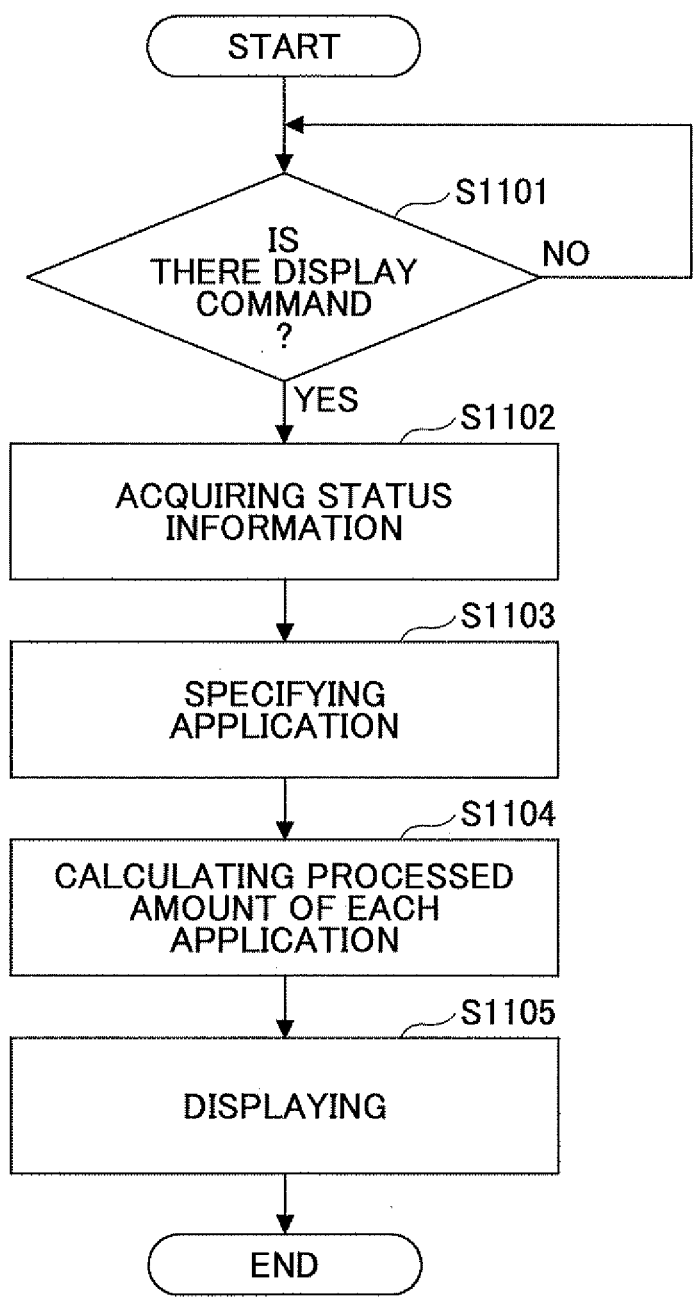
FIG. 11 is a flowchart explaining operation of the portable device of Embodiment 2.

Next, the portable device 100A of Embodiment 1 is described in reference of FIG. 11. FIG. 11 is a flowchart of the portable device of Embodiment 2.

When the portable device 100A receives a display command of a use history of the secondary battery 211 in step S1101, the portable device 100A acquires status information stored in the memory controlling part 235 of the monitoring IC 220 by a status information acquiring part 161.

The status information of Embodiment 2 is a consumption current acquired from a current value of the secondary battery 211 or the like. The monitoring IC 220 of the battery pack 200 stores a current value of the secondary battery 211 each predetermined time to thereby calculate the consumption current. The status information acquiring part 161 acquires all the consumption currents stored after the portable device 100 gets on the market and before a display command of the use history is received.

The portable device 100A specifies an application executed by the application specifying part 162 after acquiring the status information in step S1103.

The application specifying part 162 of Embodiment 2 specifies applications carried out from time to time based on change of the values of the consumption current values acquired by the status information acquiring part 161 between the shipment of the portable device 100A and a receipt of a display command of the use history.

For example, a range of the consumption currents for each application is set in the application specifying part 162. For example, the consumption current value when the application 302 is carried out is A1 or more and less than A2, and the consumption current value when the application 303 is carried out is A2 or more and less than A3.

The application specifying part 162 of the Embodiment 2 specifies the applications from time to time based on the change of the acquired consumption current value and the above setup. The application specifying part 162 specifies an application which was carried out within a term while the consumption current value is in a range of A1 or more and less than A2 to be the application 302. The application specifying part 162 specifies an application which was carried out within a term while the consumption current value is in a range of A1 or more and less than A2 to be the application 303.

When the application is specified in step S1103, the processed amount calculating part 163 calculates the processed amount of the specified application. The processed amount calculating part 163 calculates a total period while the specified application is carried out. The processed amount calculating part 163 calculates a processed amount of the specified application from the consumption current value in the calculated total period.

For example, when the total period of the specified application 302 is carried out is T1, and an application 302 is provided for realizing the call function, the processed amount may be calculated as "a duration of call T1".

Further, when the total period of executing the specified application 303 is T2 and the specified application 303 realizes a sending and receiving function of the email, the processed amount calculating part 163 calculates the sum of the consumption current consumed within the total period T2. When the total amount of the consumption current consumed within the total period T2 is B, the processed amount calculating part 163 calculates the number of the emails which can be sent and received by the total consumption current B. As a result, the processed amount of the application 303 can be expressed by the number of the sent and received emails.

The application specifying part 162 and the processed amount calculating part 163 of Embodiment 2 specify all applications carried out between the shipment of the portable device 100A and the receipt of the display command by the above processes and calculates the processed amounts for each application.

After calculating the processed amounts for each application, the use history displaying part 174 of the display control part 170A makes the display unit 12 display the use histories for each application in step S1105.

Figure 12:
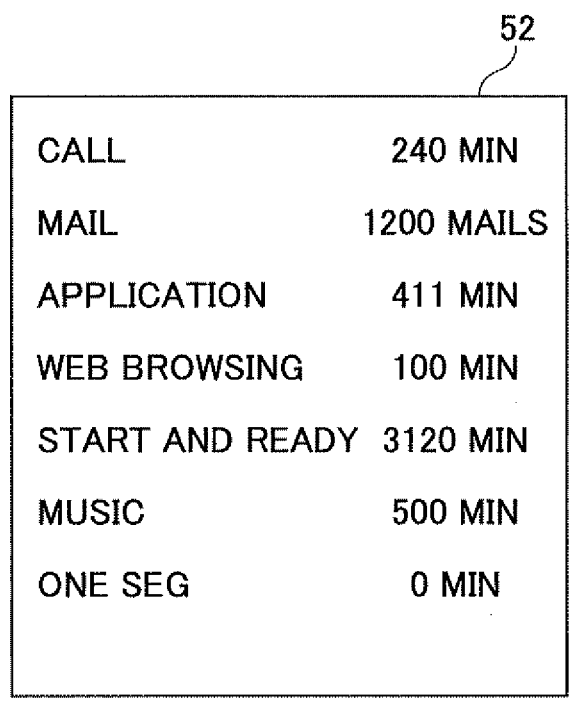
FIG. 12 shows an example screen displaying a use history of each application.

FIG. 12 shows an example screen displaying a use history of each application. The use history for each application is displayed on a screen 52.

With Embodiment 2 described above, the user can recognize whether the power of the secondary battery 211 is consumed based on the type of the application. According to Embodiment 2, it is possible to recognize how the secondary battery 211 has been used when a failure occurs in the secondary battery 211. Therefore, it is possible to determine whether there is a cause of the failure in using the secondary battery 211.

Further, with Embodiment 2, it is possible for a user to recognize the total processed amount for each application after the portable device 100a is shipped. Therefore, according to Embodiment 2, it is possible to presume a degree of degradation of the secondary battery 211.

The user may be a service man of a service center by which maintenance of the portable device 100A or the like are carried out. For example, the portable device 100A of Embodiment 2 may receive a display command of the use history when a specific operation is carried out by the service man.

Embodiment 3

Next, Embodiment 3 of the present invention is described in reference of figures. With Embodiment 3 of the present invention, an error history generated in the secondary battery 211 is displayed on a display unit 12. With Embodiment 3, only portions different from Embodiment 1 are described. The same reference symbols are used for portions similar to those of Embodiment 1, and description of these portions are omitted.

The portable device 100B acquires status information of a secondary battery 211 from a monitoring IC 220 of a battery pack 200 and makes the display unit 12 display error history of the secondary battery 211 contained in the status information. For example, the error history of the secondary battery 211 of Embodiment 3 is a date and a number of times when a temperature error of the secondary battery 211 is detected, a date and a number of times when an over-charge of the secondary battery 211 is detected, a date and a number of times when an over-discharge of the secondary battery 211 is detected, a date and a number of times when an internal short of a battery unit 210 is detected, and so on.

With Embodiment 3, an error history of the secondary battery 211 forming the battery unit 210 is displayed to thereby enable recognizing a type of error of the secondary battery 211 which was generated in the past. When the type of the past error of the secondary battery 211 is recognized, it may be possible to analyze a cause of failure of the secondary battery 211.

Figure 13:
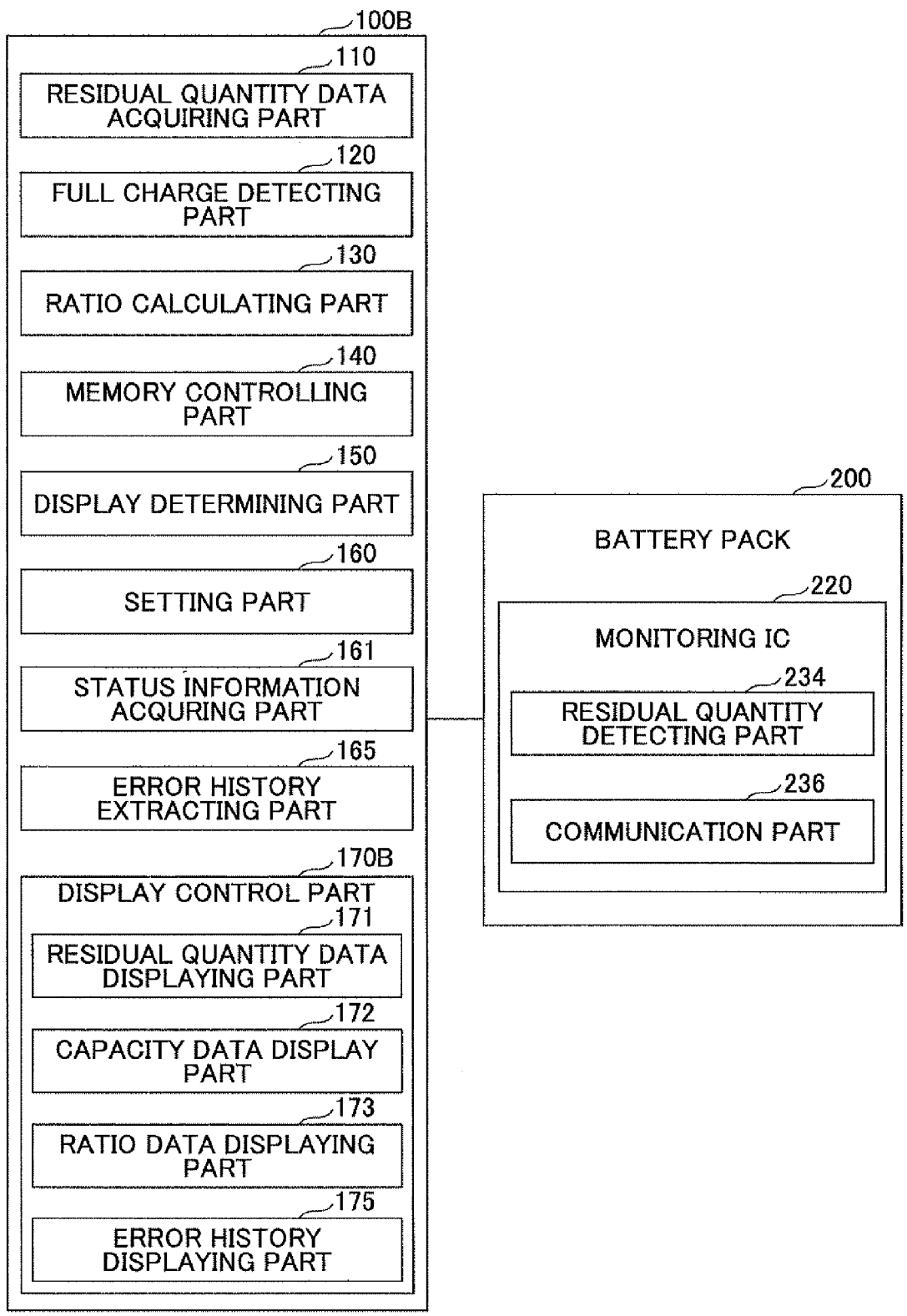
FIG. 13 illustrates a functional structure of a portable device of Embodiment 3.

Next, the portable device 100B of Embodiment 3 is described in reference of FIG. 13. FIG. 13 illustrates a functional structure of the portable device of Embodiment 3. The portable device 100B of Embodiment 3 includes a status information acquiring part 161 and an error history extracting part 165 in addition to various portions of the portable device 100 of Embodiment 1. A display control part 170B of Embodiment 3 includes the error history displaying part 165 in addition to the various portions of the display control part 170A of Embodiment 1.

The status information acquiring part 161 acquires status information of the secondary battery 211 from an IC monitoring IC 220 of the battery pack 200. With the battery pack 200 of Embodiment 3, when the error of the secondary battery 211 is detected by the protection IC 230, the error history such as a type of the detected error, a date when the error is detected, and a number of times when the error is detected is stored as status information into the memory controlling part 235 of the monitoring IC 220. The status information acquiring part 161 acquires the status information in which the error history is included from the monitoring IC 220.

The error history extracting part 165 extracts the error history of the secondary battery 211 contained in the status information which is acquired by the status information acquiring part 161. The error history displaying part 175 makes a predetermined image or the like display on a display unit 12 based on the extracted error history.

Figure 14:
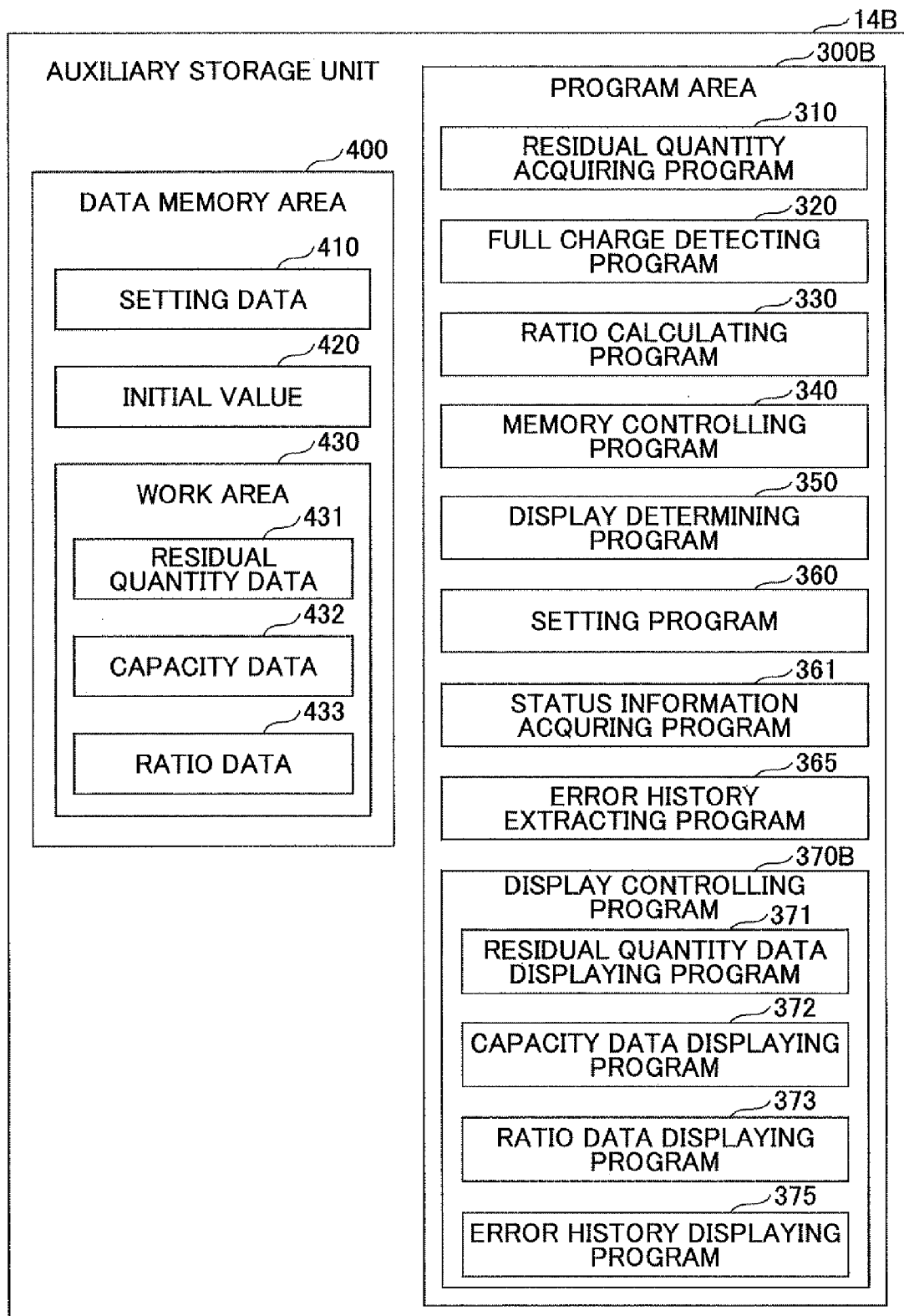
FIG. 14 explains a memory area of an auxiliary storage unit of Embodiment 3.

FIG. 14 explains a memory area of an auxiliary storage unit of Embodiment 3.

A program area 300B of an auxiliary storage unit 14B stores a status information acquiring program 361 functioning as the status information acquiring part 161, and an error history extracting program 365 functioning as the error history extracting part 165. An error history displaying program 375 functioning as the use history displaying part 175 is stored in a display controlling program 370B of the program area 300B.

Figure 15:
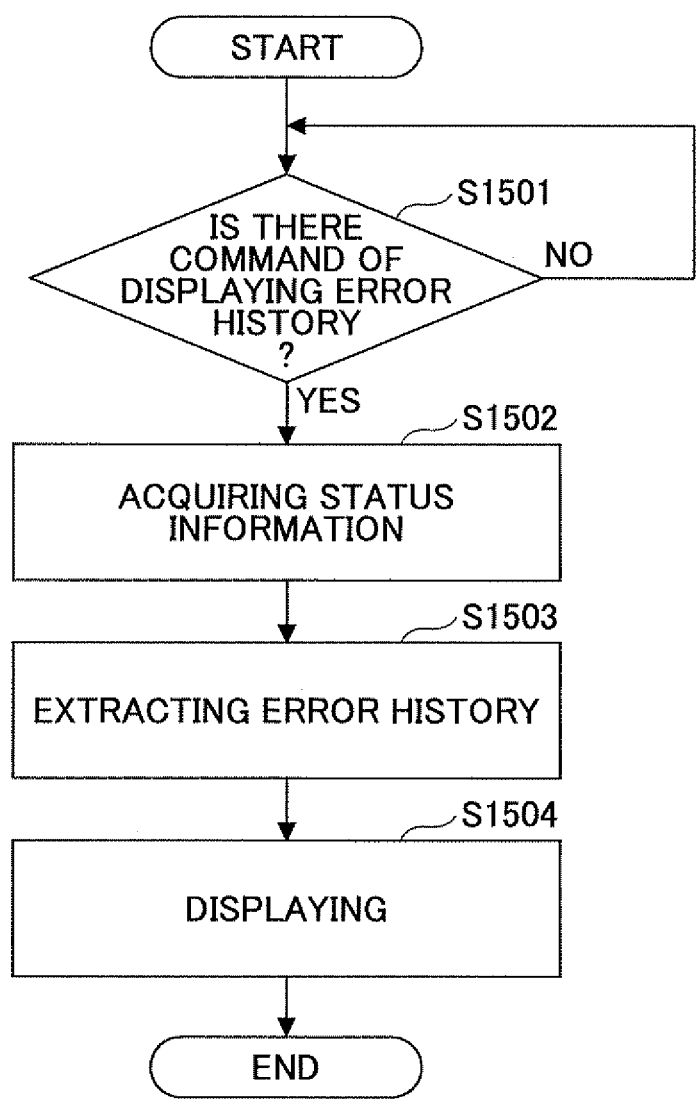
FIG. 15 is a flowchart of the portable device of Embodiment 3.

Next, the operation of the portable device 100B of Embodiment 3 is described in reference of FIG. 15. FIG. 15 is a flowchart for explaining the operation of the portable device of Embodiment 3.

The portable device 100B of Embodiment 3 receives a display command of the error history in step S1501. The status information acquiring part 161 acquires the status information from the monitoring IC 220 of the battery pack 200 in step S1502. The portable device 100B may receive a display command of the error history upon a specific operation given by a service man or the like. The status information of Embodiment 3 may include a history indicative of an error of the secondary battery 211 detected by the protection IC 230 of the battery pack 200.

The portable device 100B extracts the error history from the status information with the error history extracting part 165 in step S1503. When the error history is extracted, the display control part 170B makes the error history display on the display unit 12 with the error history displaying part 175 in step S1504. The error history displaying part 175 makes the history such as the error type based on the extracted error history. The error type may be over-discharge, over-charge, high temperature of the secondary battery 211, and internal short of the secondary battery 211 of the battery unit 210.

The error history displaying part 175 of Embodiment 2 is provided with a threshold value for determining a degree of danger for each error type. For example, when the error type is high temperature of the secondary battery 211, it is possible to display the degree of danger to be "caution needed" when the number of the errors is up to two. When the error type is over-charge, it is possible to display the degree of danger to be "danger" when the number of the errors is one.

Figure 16:
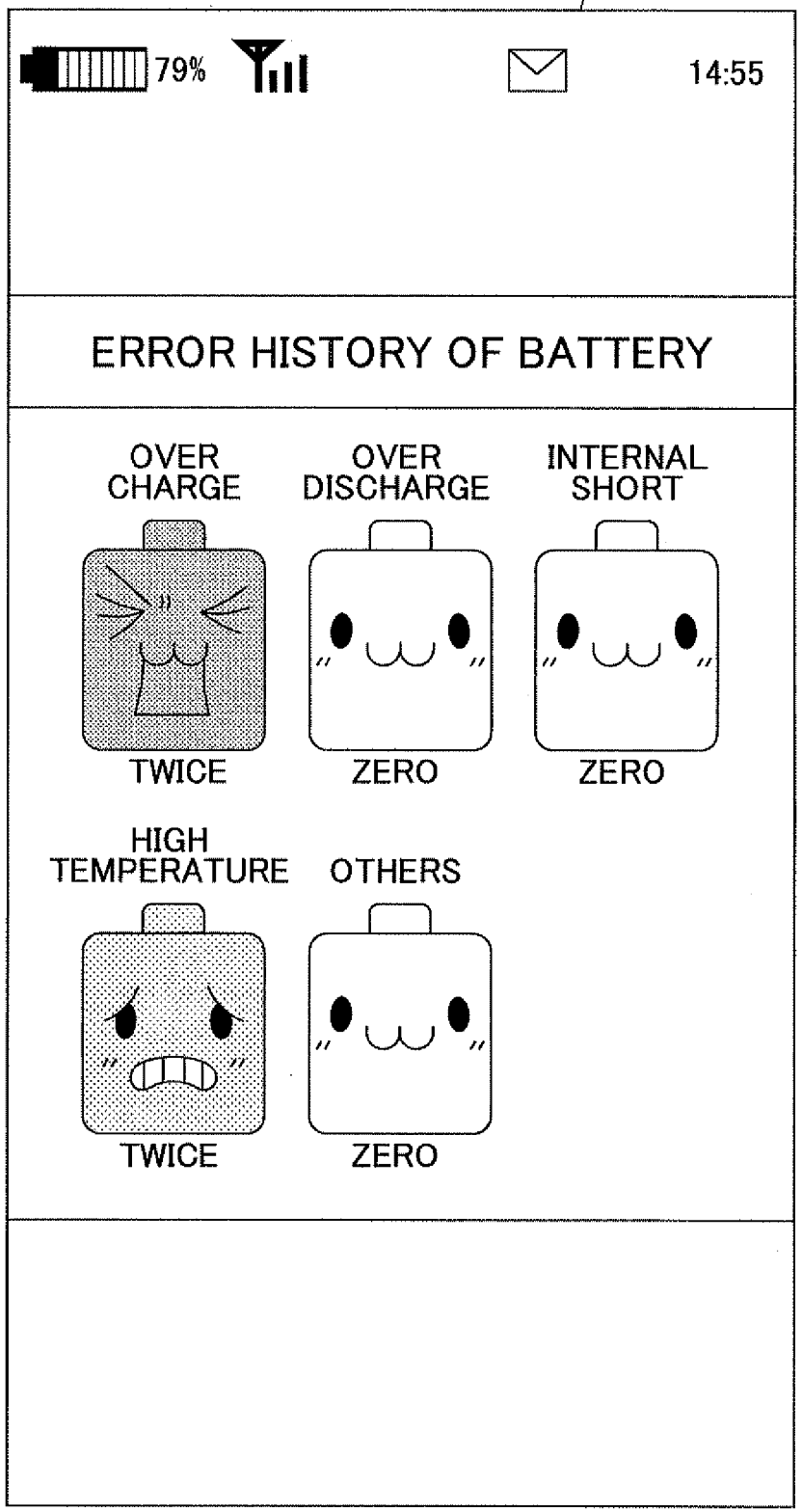
FIG. 16 illustrates an example screen displaying an error history.

FIG. 16 illustrates an example screen displaying the error history. On a screen illustrated in FIG. 16, the number of errors is displayed for each error type. Icon images indicative of the degree of danger caused by the error generation are displayed on the screen 53.

When the error type is over-charge, the icon image indicative of the degree of danger may be "danger". When the error type is high temperature, the icon image indicative of the degree of danger may be "caution needed".

In an example of FIG. 16, although the error type and the number of generating errors are displayed, a date when the error is generated may further be displayed.

As described, with Embodiment 3, by displaying the icon images having the number of generating the errors and the degree of danger, it is possible to recognize what kind of error is generated in the secondary battery 211 forming the battery unit 210. With the embodiments, it is possible to easily recognize what kind of failure of the secondary battery 211 is generated by what kind of the error.

With the embodiments, it is possible to recognize the error history. Therefore, it is possible to distinguish whether the failure generated by the secondary battery 211 is caused by degradation of the secondary battery 211 or by defects of the secondary battery 211.

With the embodiments, for example, it is possible to recognize how the error is generated in the secondary battery 211. Therefore, it is possible to recognize how the secondary battery degrades. Therefore, it is possible to prompt a user to exchange the battery pack at an appropriate timing.

Although the invention has been described with respect to specific embodiments for a complete and clear disclosure, the appended claims are not to be thus limited but are to be construed as embodying all modifications and alternative constructions that may occur to one skilled in the art that fairly fall within the basic teachings herein set forth.

INDUSTRIAL APPLICABILITY

The present invention is applicable to a portable device driven by a battery unit formed by a chargeable and dischargeable secondary battery, a battery pack installed in the portable device, a display method using the portable device, and a display program.

This patent application is based on Japanese Priority Patent Application No. 2008-249600 filed on Sep. 29, 2008, the entire contents of which are hereby incorporated herein by reference.

Explanation Of Reference Symbols

100: portable device
110: residual quantity data acquiring part
120: full charge detecting part
130: ratio calculating part
140: memory controlling part
150: display determining part
160: setting part
170: display control part
171: residual quantity data displaying part
172: capacity data display part
173: ratio data displaying part
174: use history displaying part
175: error history displaying part
200: battery pack
220: monitoring IC
230: protection IC
234: residual quantity detecting part

The invention claimed is:

1. A portable device driven by a secondary battery which is chargeable and dischargeable, the portable device comprising:
a full charge detecting unit that is connected with the secondary battery including a monitoring IC for detecting full charged states of the secondary battery, a plurality of capacity data indicative of capacities of the secondary battery in the full charged states, and time points when the full charged states are detected so as to acquire the plurality of capacity data indicative of the capacities of the secondary battery in the full charged states and the time points in the full charged states in association with the plurality of capacity data from the monitoring IC of the secondary battery;

a memory controlling unit that stores the plurality of capacity data and the corresponding time points acquired by the full charge detecting unit in a memory unit; and a display control unit that causes a display unit of the portable device to display the plurality of capacity data stored by the memory controlling unit in chronological order, which is along the time points corresponding to the plurality of capacity data.

2. The portable device according to claim 1, further comprising:

a setting unit configured to set a timing for acquiring each of the capacity data, wherein the full charge detecting unit acquires each of the capacity data at a timing set by the setting unit.

3. The portable device according to claim 1, further comprising:

a ratio calculating unit configured to calculate a ratio between an initial value of the capacity of the secondary battery and each of the capacity data, wherein the display control unit displays each of the capacity data along with the ratio.

4. The portable device according to claim 3, wherein the display control unit causes the display unit of the portable device to display each of the capacity data and the corresponding initial value of the capacity so as to compare each of the capacity data with the corresponding initial value of the capacity, and causes the display unit of the portable device to display a ratio between finally detected capacity data among the capacity data and the initial value independently from the display of each of the capacity data.

5. The portable device according to claim 1, further comprising:

a residual quantity data acquiring unit configured to acquire residual quantity data indicative of a residual quantity of the secondary battery, wherein the display control unit causes the display unit of the portable device to display the residual quantity data and the plurality of capacity data while associating the residual quantity data with the plurality of capacity data.

6. The portable device according to claim 5, wherein the display control unit causes the display unit of the portable device to display the residual quantity data and finally detected capacity data of the plurality of capacity data while associating the residual quantity data with the finally acquired capacity data.

7. A battery pack which is chargeable and dischargeable and drives a portable device including a full charge detecting unit that is connected with a secondary battery, and acquires full charged states of the secondary battery, a plurality of capacity data indicative of capacities of the secondary battery in the full charged states, and time points when the full charged states are detected, a memory controlling unit that stores the plurality of capacity data and the corresponding time points acquired by the full charge detecting unit in a memory unit, a display control unit that causes a display unit of the portable device to display the plurality of capacity data stored by the memory controlling unit in chronological order, which is along the time points corresponding to the plurality of capacity data, the battery pack comprises:

the secondary battery that includes a monitoring IC acquiring the full charged states of the secondary battery, the plurality of capacity data indicative of the capacities of the secondary battery in the full charged states, and the time points when the full charged states are detected, and providing the full charged states of the secondary battery, the plurality of capacity data indicative of the capacities of the secondary battery in the full charged states, and the time points when the full charged states are detected to the full charge detecting unit of the portable device.

8. The battery pack according to claim 7, further comprising:

a setting unit configured to set a timing of acquiring each of the capacity data, wherein the monitoring IC provides each of the capacity data to the portable device at a timing set by the setting unit.

9. A display controlling method using a portable device driven by a secondary battery which is chargeable and dischargeable, the display controlling method comprising:

detecting, by the secondary battery, full charged states of the secondary battery, a plurality of capacity data indicative of capacities of the secondary battery in the full charged states, and time points when the full charged states are detected;

storing, by the portable device, the plurality of capacity data and the corresponding time points detected by the detecting in a memory unit; and displaying, by a display unit included in the portable device, the plurality of capacity data stored by the storing the capacity data in chronological order, which is along the plurality of time points corresponding to the plurality of capacity data.

10. The display controlling method according to claim 9, further comprising:

setting a timing for acquiring each of the capacity data, wherein the detecting full charge of the secondary battery acquires each of the capacity data at a timing set by the setting.

11. The display controlling method according to claim 9, further comprising:

calculating a ratio between an initial value of the capacity of the secondary battery and each of the capacity data, wherein the displaying the capacity data displays each of the capacity data along with the ratio.

12. The display controlling method according to claim 11, wherein the displaying displays each of the capacity data and the corresponding initial value of the capacity so as to compare each of the capacity data with the corresponding initial value of the capacity, and displays a ratio between finally detected capacity data among the capacity data and the initial value independently from the display of each of the capacity data.

13. The display controlling method according to claim 9, further comprising:

acquiring residual quantity data indicative of a residual quantity of the secondary battery, wherein the displaying displays the residual quantity data and the capacity data while associating the residual quantity data with the plurality of capacity data.

14. The display controlling method according to claim 13, wherein the displaying displays the residual quantity data and finally detected capacity data of the plurality of capacity data while associating the residual quantity data with the finally acquired capacity data.

15. A non-transitory recording medium saving a display controlling program representing a sequence of instructions, the display controlling program which when executed by a computer included in a portable device driven by a chargeable and dischargeable secondary battery, the instructions cause the portable device or the chargeable and dischargeable secondary battery to function as:

detecting, by the chargeable and dischargeable secondary battery, full charged states of the secondary battery, a plurality of capacity data indicative of capacities of the secondary battery in the full charged states, and time points when the full charged states are detected;

storing, by the portable device, the plurality of capacity data and the corresponding time points detected by the detecting in a memory unit; and displaying, by a display unit included in the portable device, the plurality of capacity data stored by the storing the capacity data in chronological order, which is along the plurality of time points corresponding to the plurality of capacity data.

16. The non-transitory recording medium according to claim 15, the instructions cause the portable device to further function as:

setting a timing for acquiring each of the capacity data, wherein the detecting acquires each of the capacity data at a timing set by the setting.

17. The non-transitory recording medium according to claim 15, the instructions cause the portable device to further function as:

calculating a ratio between an initial value of the capacity of the secondary battery and each of the capacity data, wherein the displaying the capacity data displays each of the capacity data along with the ratio.

18. The non-transitory recording medium according to claim 17, wherein the displaying displays each of the capacity data and the corresponding initial value of the capacity so as to compare each of the capacity data with the corresponding initial value of the capacity, and displays a ratio between finally detected capacity data among the capacity data and the initial value independently from the display of each of the capacity data.

19. The non-transitory recording medium according to claim 15, the instructions cause the portable device to further function as:

acquiring residual quantity data indicative of a residual quantity of the secondary battery, wherein the displaying displays the residual quantity data and the capacity data while associating the residual quantity data with the plurality of capacity data.

20. The non-transitory recording medium according to claim 19, wherein the displaying displays the residual quantity data and finally detected capacity data of the plurality of capacity data while associating the residual quantity data with the finally acquired capacity data.

* * * * *